US 9,484,404 B2

(12) United States Patent
Barletta et al.

(10) Patent No.: US 9,484,404 B2
(45) Date of Patent: Nov. 1, 2016

(54) ELECTRONIC DEVICE OF VERTICAL MOS TYPE WITH TERMINATION TRENCHES HAVING VARIABLE DEPTH

(71) Applicant: STMICROELECTRONICS S.R.L., Agrate Brianza (IT)

(72) Inventors: Giacomo Barletta, Acireale (IT); Angelo Magrí, Belpasso (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/609,320

(22) Filed: Jan. 29, 2015

(65) Prior Publication Data
US 2015/0214300 A1   Jul. 30, 2015

(30) Foreign Application Priority Data

Jan. 29, 2014   (IT) .............................. MI2014A0116

(51) Int. Cl.
*H01L 29/66* (2006.01)
*H01L 29/74* (2006.01)
(Continued)

(52) U.S. Cl.
CPC ......... *H01L 29/0661* (2013.01); *H01L 29/063* (2013.01); *H01L 29/0623* (2013.01);
(Continued)

(58) Field of Classification Search
CPC ........... H01L 29/7827; H01L 29/7397; H01L 29/7813; H01L 29/7811; H01L 29/66666; H01L 29/0623; H01L 29/063; H01L 29/0661
USPC ......... 257/330, E29.262, 127, E21.418, 329, 257/737, 365, 506; 438/270, 286, 77, 589, 438/E21.41, 138, 259
See application file for complete search history.

(56) References Cited

U.S. PATENT DOCUMENTS 6,300,171 B1   10/2001   Frisina
6,870,201 B1 *   3/2005   Deboy et al. ................. 257/170
(Continued)

FOREIGN PATENT DOCUMENTS

EP   1 962 330 A2   8/2008
JP   2011-114028 A   6/2011
WO   2006/046388 A1   5/2006

OTHER PUBLICATIONS

Oh et al., "A New Junction Termination Method Employing Shallow Trenches Filled With Oxide," *IEEE Electron Device Letters* 25(1):16-18, Jan. 2004.
(Continued)

*Primary Examiner* — Dzung Tran
(74) *Attorney, Agent, or Firm* — Seed IP Law Group PLLC

(57) ABSTRACT

An electronic device is integrated on a chip of semiconductor material having a main surface and a substrate region with a first type of conductivity. The electronic device has a vertical MOS transistor, formed in an active area having a body region with a second conductivity type. A set of one or more cells each one having a source region of the first conductivity, a gate region of electrically conductive material in a gate trench extending from the main surface in the body region and in the substrate region, and an insulating gate layer, and a termination structure with a plurality of termination rings surrounding at least part of the active area on the main surface, each termination ring having a floating element of electrically insulating material in the termination trench extending from the main surface in the chip and at least one bottom region of said semiconductor material of the second conductivity type extending from at least one deepest portion of a surface of the termination trench in the chip; the termination trenches have a depth from the main surface decreasing moving away from the active area.

28 Claims, 28 Drawing Sheets

(51) Int. Cl.
*H01L 21/70* (2006.01)
*H01L 29/06* (2006.01)
*H01L 29/78* (2006.01)
*H01L 29/739* (2006.01)

(52) U.S. Cl.
CPC ..... *H01L29/66666* (2013.01); *H01L 29/7397* (2013.01); *H01L 29/7811* (2013.01); *H01L 29/7813* (2013.01); *H01L 29/7827* (2013.01)

(56) References Cited

U.S. PATENT DOCUMENTS

| 7,291,894 | B2 | 11/2007 | Sapp et al. | |
| 7,800,185 | B2 | 9/2010 | Hshieh | |
| 2003/0193067 | A1* | 10/2003 | Kim et al. | 257/343 |
| 2004/0021195 | A1* | 2/2004 | Kurosaki et al. | 257/506 |
| 2004/0132252 | A1 | 7/2004 | Merchant | |
| 2005/0023607 | A1* | 2/2005 | Sapp et al. | 257/329 |
| 2005/0029585 | A1* | 2/2005 | He et al. | 257/330 |
| 2007/0001194 | A1 | 1/2007 | Ono et al. | |
| 2008/0087951 | A1* | 4/2008 | Takaya et al. | 257/334 |
| 2008/0179662 | A1* | 7/2008 | Hshieh | 257/328 |
| 2010/0044788 | A1 | 2/2010 | Hirler et al. | |
| 2012/0043602 | A1 | 2/2012 | Zeng et al. | |
| 2013/0270668 | A1* | 10/2013 | Huang et al. | 257/471 |

OTHER PUBLICATIONS

Siemieniec et al., "Space-saving edge-termination structures for vertical charge compensation devices," 13$^{th}$ European Conference on Power Electronics and Applications, Barcelona, Spain, Sep. 8-10, 2009, pp. 1-10.

Taur et al. (eds.), *Fundamentals of modern VLSI devices*, chapter 2. Basic Device Physics, pp. 92-93, Cambridge University Press, 1998.

* cited by examiner

ELECTRONIC DEVICE OF VERTICAL MOS TYPE WITH TERMINATION TRENCHES HAVING VARIABLE DEPTH

BACKGROUND

1. Technical Field

The present disclosure relates to the field of electronic devices. More specifically, this disclosure relates to electronic devices based on vertical MOS transistors.

2. Description of the Related Art

Electronic devices integrated on corresponding chips of semiconductor material, each one based on one or more MOS transistors, are commonly used in a number of applications. Particularly, in a vertical MOS transistor (also known as trench MOS transistor, or UMOS), a gate region (generally with a cellular structure) is formed in one or more gate trenches being dug in an active area of the chip, which gate trenches are covered by a layer of electrically insulating material (such as gate oxide) and then filled with a layer of electrically conductive material (such as doped polysilicon). As a consequence, during operation of the MOS transistor, its channel region extends along the vertical walls of the gate trenches of the gate so as to be relatively wide, thereby allowing the MOS transistor to support relatively high operating voltages. This structure is then particularly advantageous in power applications, wherein the operating voltages of the (power) electronic devices may reach values of the order of 500-2,000V (for example, for use in the control of motors, in voltage converters, in class-D amplifiers).

Generally, the operating voltages that may be supported by each MOS transistor are limited by its breakdown voltage, over which the MOS transistor conducts current in an uncontrolled way with risk of damaging it and/or other circuit elements connected thereto.

A known technique for increasing the breakdown voltage of the MOS transistor provides making a termination structure arranged around the active area (typically on an edge of the chip); the termination structure is designed so as to distribute an electric field that normally concentrates at the periphery of the active area, thereby reducing its intensity. The termination structures may be made in several ways, for example, with LOCOS, field-plates or guard-rings.

Particularly, as described in "Space-saving edge-termination structures for vertical charge compensation devices, R. Siemieniec, F. Hirler, C. Geissler, 13th European Conference on Power Electronics and Applications, 2009. EPE '09, ISBN: 978-1-4244-4432-8" (the entire disclosure of which is herein incorporated by reference), the termination structure may be formed by one or more rings of trenches. The trench of each ring is filled with oxide; moreover, regions of P-type semiconductor material are implanted superficially between the trenches and they are implanted buried beneath them. The trenches should be kept sufficiently spaced apart, so as to avoid that the buried regions should join because of next thermal processes.

In order to obtain a better distribution of the electric field and to avoid a fringing of its field lines in correspondence to the bottom (or basal) regions of the outermost gate trenches (which are most stressed by the electric field), it is also possible to make a deep edge ring (or mesh, the mesh is formed by forming trenches within the edge ring, which separates the edge ring into a mesh shape); such edge ring has a depth greater than the one of the gate trenches, so that the outermost gate trenches are sunk therein. In this way, a significant attenuation is obtained of the electric field at the basal regions of the outermost gate trenches.

However, the manufacturing of the deep edge ring is rather complex; particularly, the manufacturing complexity of the deep edge ring increases with the depth of the gate trenches. Therefore, this is particularly acute in the power electronic devices, wherein the gate trenches are typically very deep (for example, of the order of 6-10 μm).

Particularly, the manufacturing of deep edge ring uses specific machinery; for example, ion implanters at high energies are used to implant corresponding dopants and ovens at high temperatures are used to diffuse such dopants deeply. In addition, deep diffusion of the dopants is achieved with a relatively long time period to move the dopants. Alternatively, it is possible to use dopants with higher diffusion rate (such as Al).

In any case, the manufacturing of the deep edge ring does not use standard manufacturing processes (i.e., machinery and/or dopants), and it is therefore not of general applicability.

Moreover, the non-standard or long manufacturing processes of the deep edge ring have a negative impact on the final cost of the corresponding electronic devices.

A simplified summary of the present disclosure is herein presented in order to provide a basic understanding thereof; however, the sole purpose of this summary is to introduce some concepts of the disclosure in a simplified form as a prelude to its following more detailed description, and it is not to be interpreted as an identification of its key elements nor as a delineation of its scope.

BRIEF SUMMARY

In general terms, the present disclosure is based on the idea of making termination trenches with variable depths.

Particularly, an aspect provides an electronic device integrated on a chip of semiconductor material, which comprises at least one vertical MOS transistor formed in an active area of the chip with a termination structure having a plurality of termination rings each one comprising at least one floating insulated dummy element in at least one termination trench, wherein the termination trenches have a depth decreasing moving away from the active area. The termination trenches may be formed as two groups; a first group of dummy insulated cells that are formed in the active area of the chip and a second group of cells that are totally or partially buried under a field oxide, which is spaced from the active area.

A further aspect provides a system comprising one or more of such electronic devices.

A further aspect provides a corresponding method for manufacturing such electronic device.

BRIEF DESCRIPTION OF THE SEVERAL VIEWS OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessary drawn to scale (with some details that may be exaggerated and/or simplified) and that, unless otherwise indicated, they are merely used to conceptually illustrate the structures and procedures described herein. Particularly.

DETAILED DESCRIPTION

Figure 1:
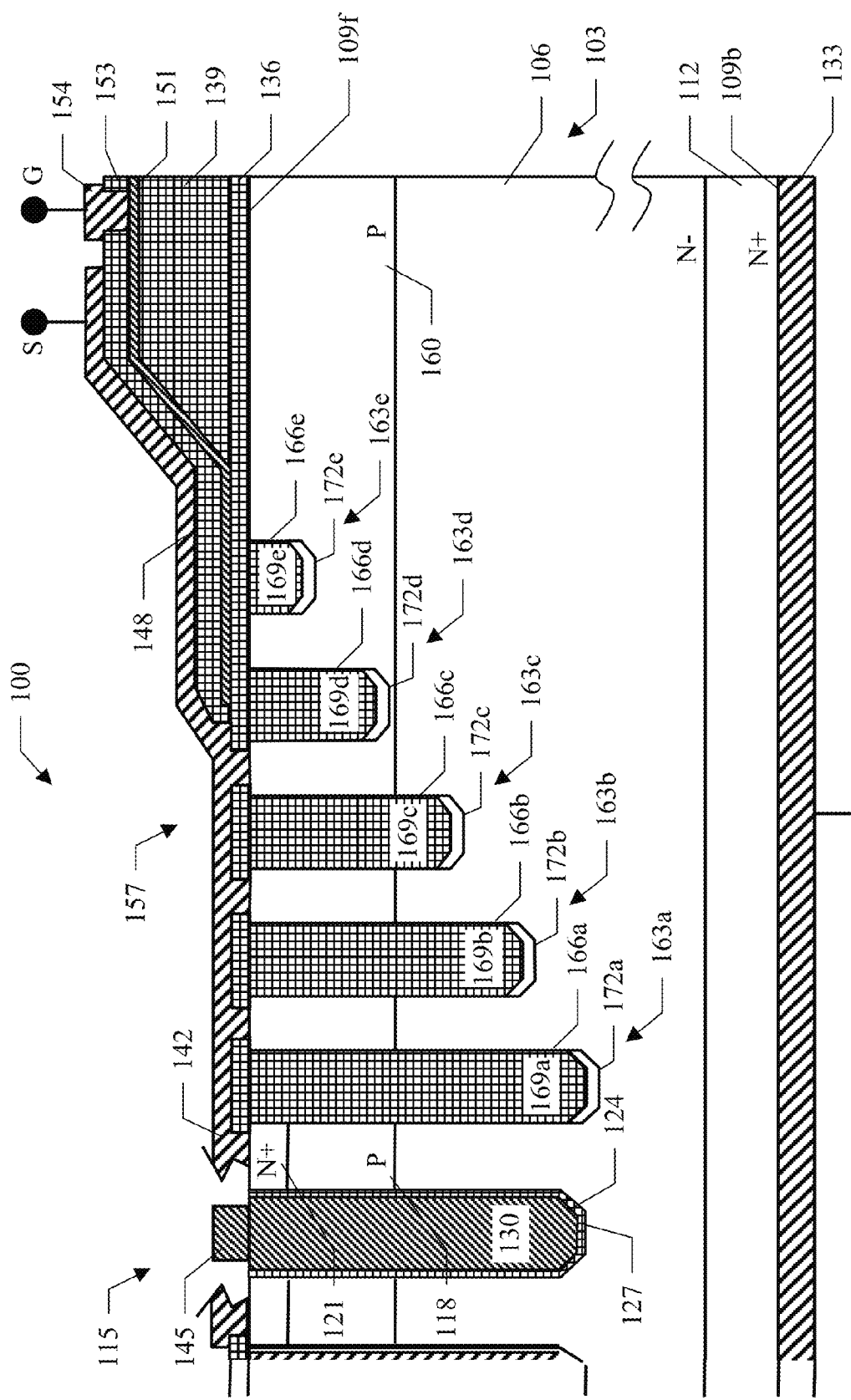
FIG. 1 shows a schematic cross-section representation of a portion of an electronic device according to an embodiment of the present disclosure.

With reference in particular to FIG. 1, a schematic cross-section representation is shown of a portion of an electronic device 100 according to an embodiment of the present disclosure.

The electronic device 100 is integrated on a chip 103 of the semiconductor material (for example, silicon). As usual, the semiconductor material is doped with impurities (or dopants) of N-type (for example, phosphorus) or P-type (for example, boron). The dopant concentrations are denoted by adding the sign + or the − sign to the letters N and P to indicate a high concentration or a low concentration, respectively, of dopants, whereas the letters N and P alone denote concentrations of intermediate value.

Particularly, the chip 103 comprises a substrate region 106 of N-type, which extends between a (main) front surface 109*f* and a (main) back surface 109*b* of the chip 103, opposite to each other. The electronic device 100 comprises an MOS transistor (or more) having a vertical structure; particularly, the MOS transistor implements a power device for use at operating voltages of relatively high value (for example, up to 500-2,000V).

The MOS transistor comprises a drain region 112, which is formed by a layer of N+ type that extends from the surface 109*b* in the substrate region 106. The MOS transistor has a cellular structure, with a plurality of cells (for example, interdigitated) that are formed in an active area 115 of the chip 103 (which takes most of it in the middle of the surface 109*f*). The active area 115 comprises a body region 118 (or more) of the P type that extends from the surface 109*f* in the substrate region 106. Each cell comprises a source region 121 of N+ type that extends from the surface 109*f* in the body region 118. The cell further comprises a gate trench 124 that extends from the surface 109*f* in the body region 118 and in the substrate region 106; the gate trench 124 is lined internally by an insulating gate layer 127 of electrically insulating material (for example, silicon oxide) being relatively thin, and it is then filled with a gate region 130 of electrically conductive material (for example, doped polysilicon). In this way, a portion of the substrate region 106 between the drain region 112 and the active area 115 defines a drift region of the MOS transistor.

A drain contact 133 is formed by a layer of electrically conductive material (for example, metal), which contacts the drain region 112 on the surface 109*b*. The surface 109*f* is covered with a protection layer 136 of electrically insulating material (for example, thermal oxide); a field oxide layer 139 (thicker than the protective layer 136) covers an outermost portion of the protective layer 136 around the active area 115 up to an edge of the chip 103. For each cell of the MOS transistor, a source contact 142 and a gate contact 145 of electrically conductive material (for example, metal for the source contact 142 and again doped polysilicon for the gate contact 145) contact the source region 121 and the gate region 130, respectively, through corresponding windows opened in the protection layer 136 (with the protective layer 136 and the source contact 142 partially removed in the figure to make visible the gate contact 145 being hidden behind them). The drain contact 133 defines a drain terminal D of the MOS transistor. All the source contacts 142 are electrically connected together, for example, through metal tracks 148, so as to define a source terminal S of the MOS transistor. All the gate contacts 145 are electrically connected together, for example, through doped polysilicon tracks 151, which are covered by an intermediate layer 153 of electrically insulating material (for example, Nitride) that separates them from the metal tracks 148; a gate tap 154 of electrically conductive material (for example, metal) contacts the doped polysilicon tracks 151 through a window opened in the intermediate layer 153 so as to define a gate terminal G of the MOS transistor (with a pad over the field oxide layer 139).

Figure 3:
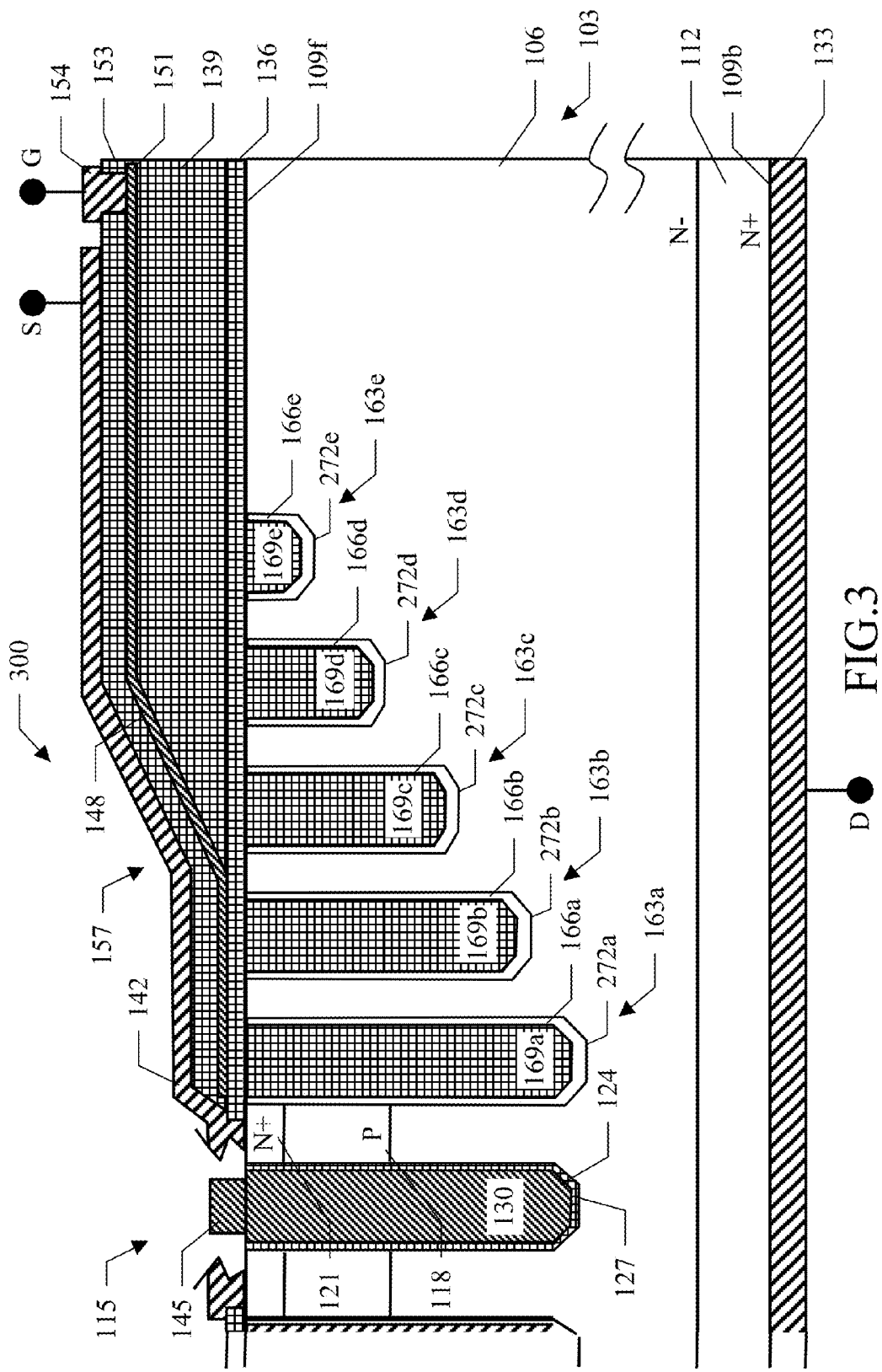
FIG. 3 shows a schematic cross-section representation of a portion of an electronic device according to a further embodiment of the present disclosure.

The MOS transistor further comprises a termination structure 157 around the active area 115 (on the surface 109*f*). The termination structure 157 comprises an edge ring (mesh) 160, which is formed by a P-type region that extends from the portion of the surface 109*f* left free by the active area 115 (i.e., a frame that surrounds it up to an edge of the chip 103) in the substrate region 106. The termination structure 157 further comprises a plurality of termination rings (five in the example at issue, indicated with the references 163*a*-163*e*), which surround (at least in part) the active area 115 (i.e., with an innermost first termination ring 163*a* around the active area 115 and each outer next further termination ring 163*b*-163*e* around the previous termination ring 163*a*-163*d*). Three of the termination rings 163*a*-163*c* are dummy insulation rings or structures that surround the active area. The edge ring (mesh) 160 is electrically biased by the source metal layer 148. The other two termination rings, 163*d*, 163*e*, may be insulated rings that are embedded into the edge ring (mesh) 160. These two termination rings 163*d*, 163*e* may be buried under the protective layer 136 to separate the edge ring (mesh) 160 from the source metal layer 148. In FIG. 3, the termination rings may be buried under the field oxide 139 so that the edge ring (mesh) 160 is not directly contacted by the source metal layer 148.

Figure 2:
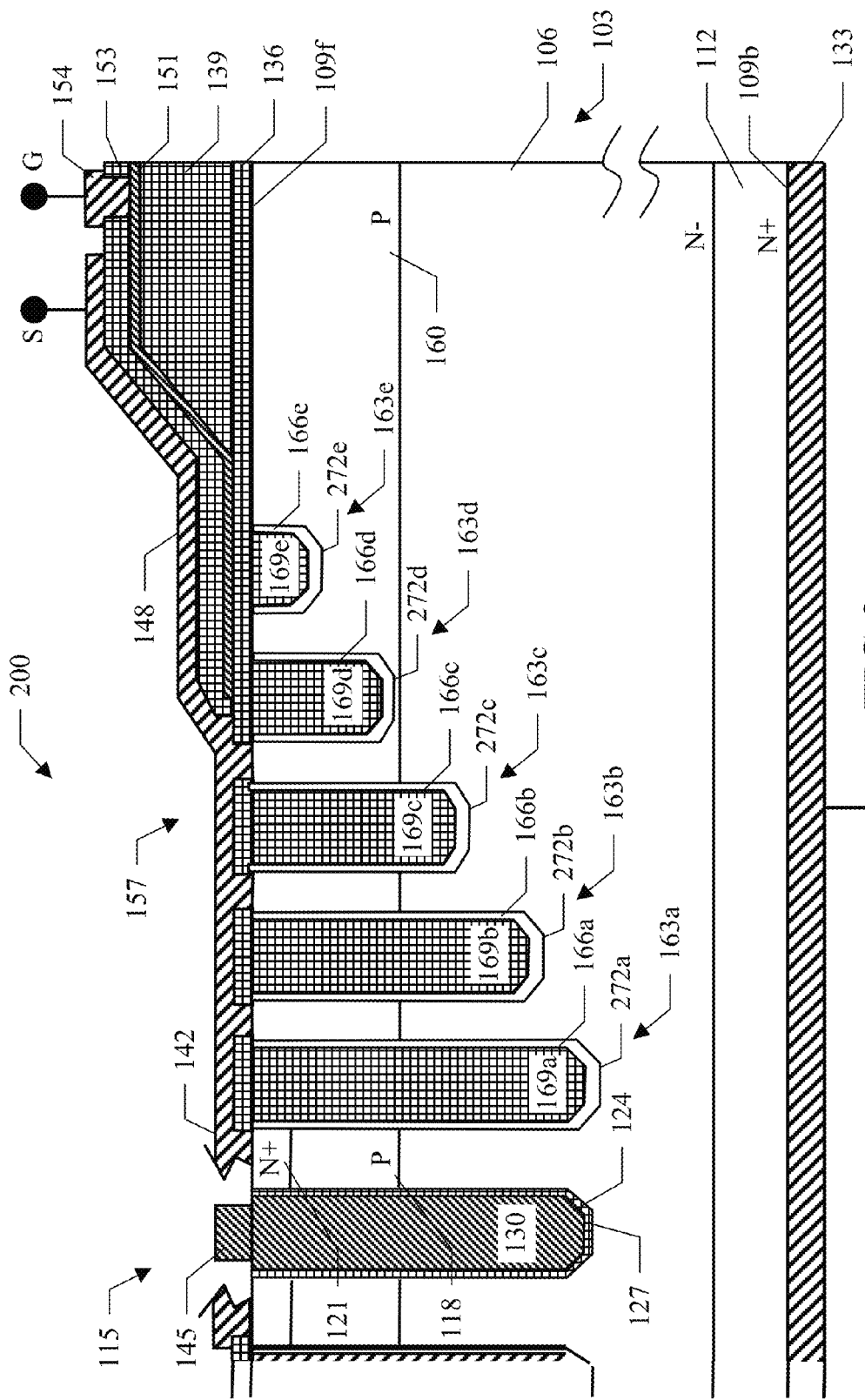
FIG. 2 shows a schematic cross-section representation of a portion of an electronic device according to a further embodiment of the present disclosure.

The plurality of termination rings includes two groups, a first group is floating (or dummy) insulated trenches and the second group is true insulated trenches. The floating (or dummy) insulated trenches are surrounded by the source metal 148 and electrically contact the edge ring (mesh) laterally, for example, trenches 169*a*-169*c* in FIG. 1. The true insulated trenches are separated from the source metal 148 by the protective layer 136 (or field oxide). These true insulated trenches do not electrically contact the source metal, for example, trenches 169*d*, 169*e* in FIG. 1. The termination structure may have a combination of the first group and the second group (FIG. 1) or may be formed from just one of the first group and second group (FIG. 2).

The first group of floating insulated trenches each is covered by a portion of the protective layer 136. The source metal 148 covers the portions of the protective layer 136 and covers an exposed top surface 109*f* of the substrate, which is also the exposed top surface of the edge ring (mesh) 160. The source metal 148 biases the doped edge ring 160. In an alternative embodiment, such as is shown in FIG. 3, the first group of floating insulated trenches is covered by the protective layer 136, which is a continuous layer as opposed to the portions in FIG. 1. The source metal 148 is separated from the top surface 109*f* of the substrate such that the source metal 148 does not interact with the top surface as it does in FIG. 1.

Each termination ring 163*a*-163*e* comprises one or more termination trenches 166*a*-166*e*, which extends from the surface 109*f* in the wafer 103; particularly, all the termination trenches 166*a*-166*e* extend in the edge ring 160, with two or more of the deepest termination trenches (such as the termination trenches 166*a*-166*c* in the example at issue) that extend in the substrate region 106 as well. Each termination trench 166*a*-166*e* is filled with a floating element 169*a*-169*e* of electrically insulating material (for example, TEOS). A bottom region 172*a*-172*e* of P-type extends from at least a deepest portion (with respect to the surface 109*f*) of a surface of the termination trench 166*a*-166*e* in the chip 103.

In the solution according to an embodiment of the present disclosure, the termination trenches 166*a*-166*e* have a depth (from the surface 109*f*) decreasing moving away from the active area 115.

This allows obtaining bottom regions 172*a*-172*e* localized at decreasing depth (between the gate trench 124 and the edge ring 160).

As a consequence, the electric field at the basal regions of the outermost gate trenches 124 is shifted towards the termination trenches 166*a*-166*e* (for example, the first termination trench 166*a* and possibly the second termination trench 166*b*), or at least it is mitigated.

This greatly increases the breakdown voltage of the MOS transistor. For example, simulations have shown that the structure described above reduces the presence of hot spots (with high concentration of the electric field) in the basal regions of the outermost gate trenches 124 (for example, with a single hot spot towards the inside of the active area 115 instead of two hot spots towards both the inside and the outside of the active area 115). Furthermore, this structure reduces an ionization coefficient that measures the probability of charge injection effects from the substrate region 106 in the gate region 130 because of impact ionization. As a consequence, the structure involves a substantial increase (for example, 5-15%) of the breakdown voltage between the drain terminal D and the source terminal S (up to values of the order of 1-2 kV).

In the specific embodiment of the figure, each bottom region 172*a*-172*e* extends only from a bottom portion of the corresponding termination trench 166*a*-166*e*; accordingly, the bottom regions 172*a*-172*c* (of the deepest termination trenches 166*a*-166*e* that extend in the substrate region 106 as well) are separated from the edge ring 160, and they are then floating. Therefore, during the operation of the MOS transistor, as the operating voltage (and then the electric field in the substrate region 106) increases the PN junctions formed between each bottom region 172*a*-172*c* and the substrate region 106 (being reverse biased) will progressively suffer a phenomenon of punch-through. Particularly, the first bottom region 172*a* will be biased to a voltage corresponding to that of the basal regions of the outermost gate trenches 124. As soon as a depletion region in the substrate region 106 around the first bottom region 172*a* reaches the second bottom region 172*b*, it will be biased to the corresponding voltage reduced by the voltage drop between them. The process continues (as the operating voltage increases) until the edge ring 160 is reached. In this way, it is obtained a single sloped PN junction, which gradually reduces the electric field from the periphery of the active area 115 to the surface 109*f*, thereby avoiding (or at least substantially limiting) a fringing of its field lines in correspondence to the basal regions of the outermost gate trenches 124.

Moreover, in the specific embodiment of the figure the first termination trench 166*a* has substantially the same depth of the gate trenches 124 (for example, 4-20 μm, with a tolerance of 1-10 nm). The further termination trenches 166*b*-166*e* instead have strictly decreasing depth (for example, with a constant pitch of 0.1-2 μm, preferably 0.5-1.5 μm and still more preferably 0.7-1.3 μm, such as 1 μm).

This allows increasing the contribution of the outermost termination trenches (for example, the termination trenches 166*b*-166*e*) to the distribution of the electric field.

Moreover, in the specific embodiment the source terminal S is electrically connected to the chip 103 between the termination trenches 166*a* and 166*b*, between the termination trenches 166*b* and 166*c*, and between the termination trenches 166*c* and 166*d* (by the metal tracks 148 that contact the edge ring 160 through corresponding windows opened in the protection layer 136).

This allows re-establishing an electrical continuity of the edge ring 160 that would be jeopardized by the termination trench 166*a* at the same depth of the gate trench 124. As a consequence, the breakdown voltage of the MOS transistor is further increased.

Moreover, in the specific embodiment of FIG. 1 the termination trenches 166*a*-166*e* do not reach the field oxide 139 (on the surface 109*f*), so that they are not covered by it.

This structure is extremely simple to implement.

With reference now to FIG. 2, a schematic cross-section representation is shown of a portion of an electronic device 200 according to a further embodiment of the present disclosure.

The electronic device 200 differs from the one described above in that bottom regions (differentiated with the references 272*a*-272*e*) extend along the entire surface of the termination trenches 166*a*-166*e*. In this way, the bottom regions 272*a*-272*c* of the deepest termination trenches 166*a*-166*c* as well reach the edge ring 160, with the bottom region 272*a* of the first termination trench 166*a* that further reaches the body region 118; as a consequence, an electrical connection is made between the body region 118 and the edge ring 160 via the bottom regions 272a-272e. In this way, there is obtained a single sloped PN junction, which as above gradually reduces the electric field from the periphery of the active area 115 to the surface 109f, thereby avoiding (or at least substantially limiting) a fringing of its field lines in correspondence to the basal regions of the outermost gate trenches 124.

Particularly, the electric field is now distributed vertically along the bottom regions 272a-272e (with an effect known as charge compensation, wherein acceptors holes that compensate the donor electrons from the substrate region 106 are located in proximity thereof, laterally and along their entire extent), thereby generating a further increase of the breakdown voltage of the MOS transistor.

With reference now to FIG. 3 a schematic cross-section representation is shown of a portion of an electronic device 300 according to a further embodiment of the present disclosure.

The electronic device 300 differs from the one described above in that the termination structure 157 is integrated buried beneath the field oxide 139 (totally or partially as in the example at issue). In addition, the termination structure 157 may either comprise or not (as in the example at issue) the edge ring; therefore, in the absence of the edge ring all the termination trenches 166a-166e and all the bottom regions 272a-272e extend in the substrate region 106.

In this case as well, as the operating voltage increases the progressive punch-through of the PN junctions formed between each bottom region 272a-272c and the substrate region 106 creates a single sloped PN junction, which gradually reduces the electric field from the periphery of the active surface 115 to the surface 109f. This allows achieving results comparable to those of the structures described above even without the edge ring (mesh) 160.

Moreover, in the specific embodiment of the figure most of the termination trenches 166a-166b are covered by the field oxide 139 (on the surface 109f), with one or more of the innermost termination trenches (for example, the termination trenches 166a-166b in the figure) that may reach the active area 115.

This structure is extremely compact (thereby allowing reducing the size of the entire electronic device 300).

Figure 4:
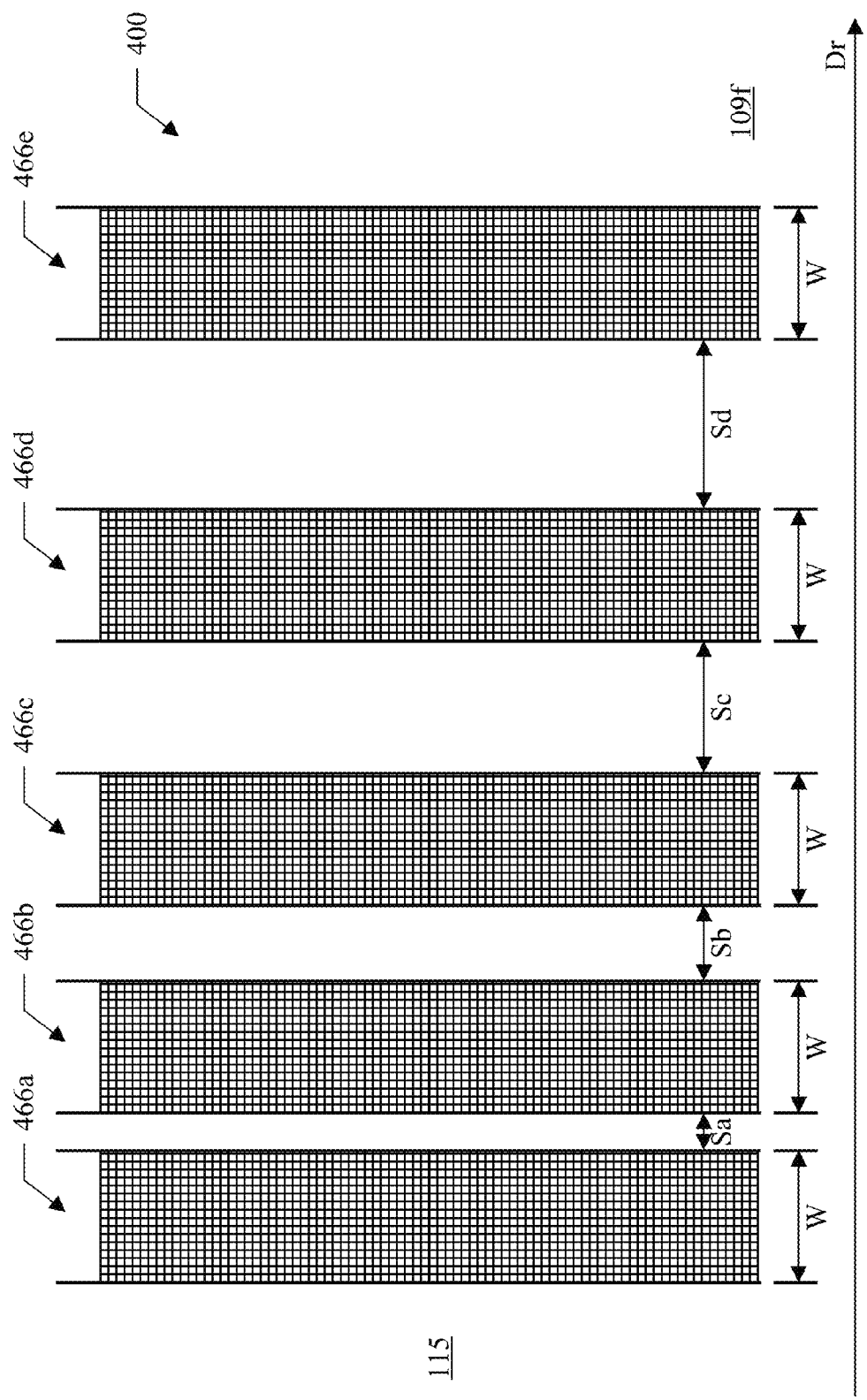
FIG. 4 shows a schematic plan-view representation of a portion of an electronic device according to an embodiment of the present disclosure.

With reference now to FIG. 4, it shows a schematic plan-view representation of a portion of an electronic device 400 according to an embodiment of the present disclosure.

In this case, termination trenches (differentiated with the references 466a-466e) have a continuous structure; therefore, each termination structure comprises a single termination trench 466a-466e (strip-like shaped on the surface 109f, with only a straight portion thereof shown in the figure), which defines a closed ring that completely surrounds the active area 115. The termination trenches 466a-466e have the same width W, for example, 1-2 μm (along a direction Dr moving away from the active area radially). The termination trenches 466a-466e are instead at increasing distance moving away from the active area 115 (along the direction Dr). For example, the distance Sa–Sd of each termination trench 466b-466e from the previous termination trench 466a-466d, respectively, increases linearly by 5-35%, preferably 10-30%, and still more preferably of 15-25%, such as 20% (for example, from 0.1-0.3 μm to 1-3 μm).

Figure 5:
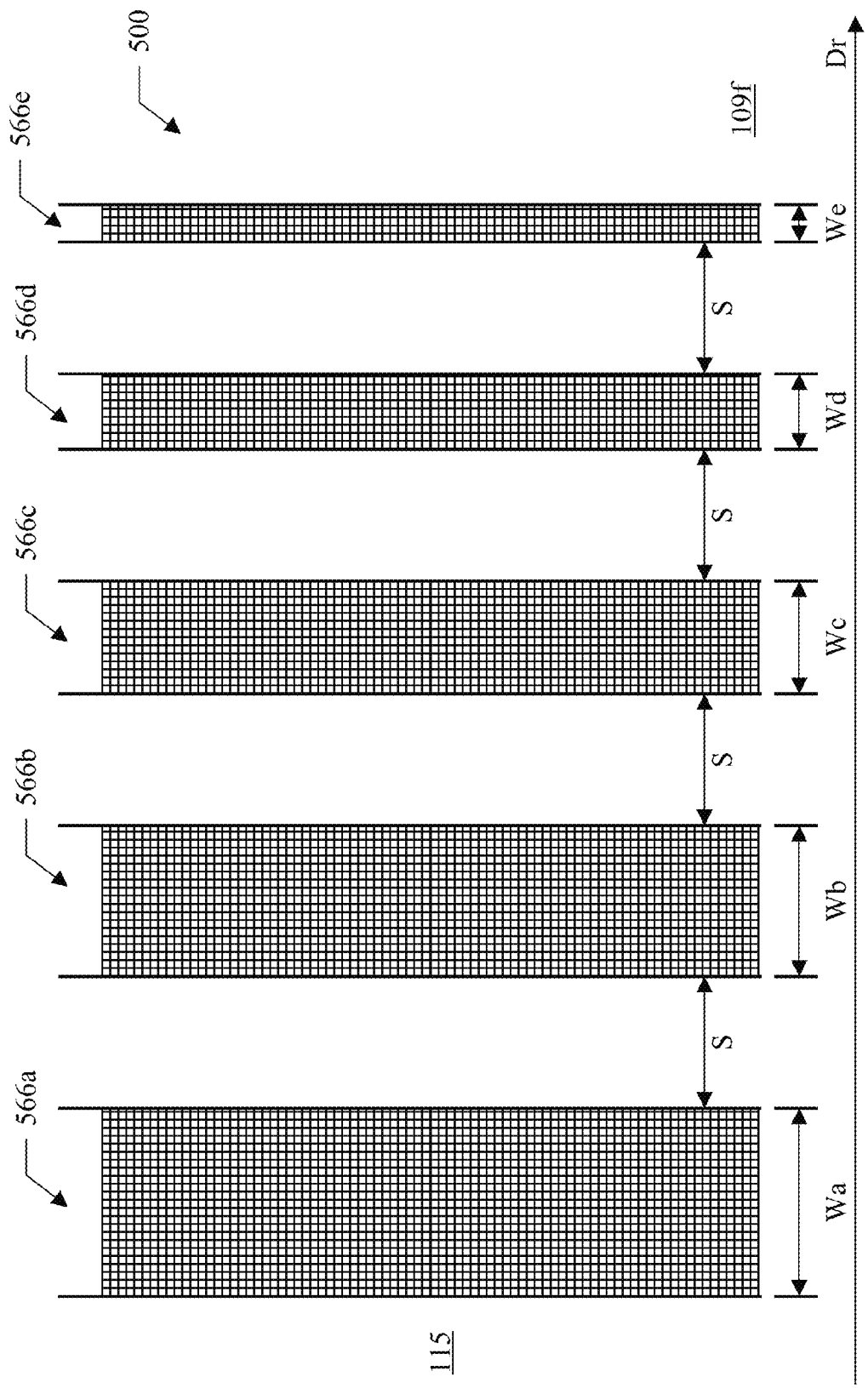
FIG. 5 shows a schematic plan-view representation of a portion of an electronic device according to a further embodiment of the present disclosure.

With reference now to FIG. 5, it shows a schematic plan-view representation of a portion of an electronic device 500 according to a further embodiment of the present disclosure.

The electronic device 500 differs from the one described above in that termination trenches (differentiated with the references 566a-566e) are equidistant one from another, for example, with a same distance S=1-2 μm (along the direction Dr) between each pair of adjacent termination trenches 566a-566e. The termination trenches 566a-566e instead have a width that decreases moving away from the active area 115 (along the direction of Dr). For example, the width Wa–We of the termination trenches 566a-566e, respectively, decreases linearly by 5-35%, preferably 10-30%, and still more preferably 15-25%, such as 20% between each pair of adjacent termination trenches 566a-566e (for example, from 1-3 μm to 0.1-0.3 μm).

Figure 6:
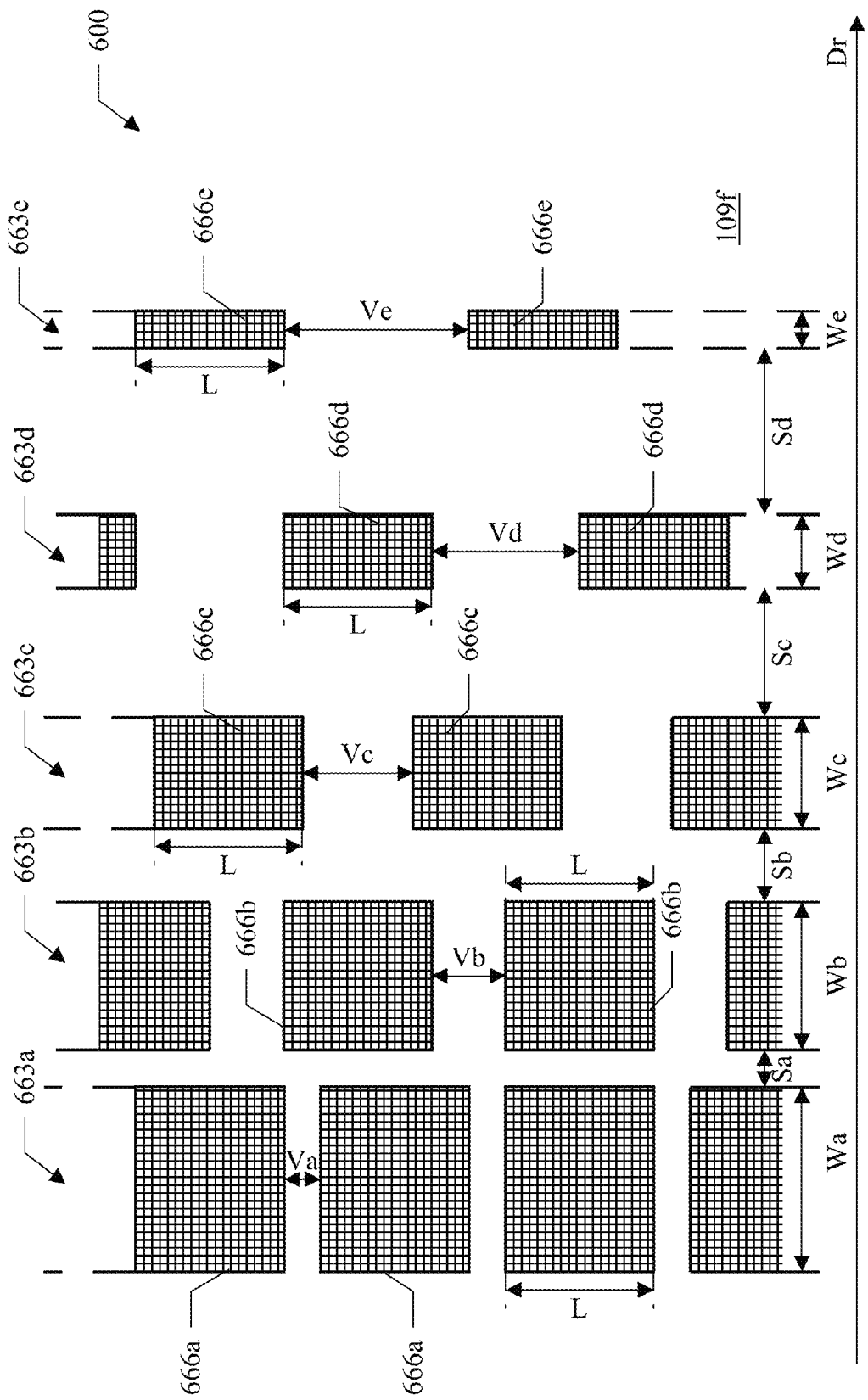
FIG. 6 shows a schematic plan-view representation of a portion of an electronic device according to a further embodiment of the present disclosure.

With reference now to FIG. 6, it shows a schematic plan-view representation of a portion of an electronic device 600 according to a further embodiment of the present disclosure.

The electronic device 600 differs from the ones described above in that termination trenches (differentiated with the references 666a-666e) have a discontinuous structure, staggered between each pair of termination rings (differentiated with the references 663a-663e); therefore, each termination ring 663a-663e comprises a plurality of termination trenches 666a-666e (for example, rectangular-shaped on the surface 109f, with only those in a straight portion of the termination trenches 666a-666e shown in the figure), which define a ring that partially surrounds the active area 115. The termination trenches 666a-666e have a length L that may be either the same for all the termination trenches 666a-666e (as shown in the figure) or different among them, for example, 1-2 μm (transversely to the direction Dr). The termination trenches 666a-666e of each termination ring 663a-663e are instead at increasing distance among them (transversely to the direction Dr) moving away from the active area 115 (along the direction Dr); for example, the distance Va–Ve between each pair of adjacent termination trenches 666a-666e, respectively, increases linearly by 5-35%, preferably 10-30%, and still more preferably 15-25%, such as 20% (for example, from 0.1-0.3 μm to 1-3 μm). In addition, the termination trenches 666a-666e of the termination rings 663a-663e are at increasing distance Sa–Sd and have decreasing width Wa–We moving away from active area 155 as above.

All the structures described above further improve the gradual reduction of the electric field from the periphery of the active area 115 to the surface 109f.

Figure 7A:
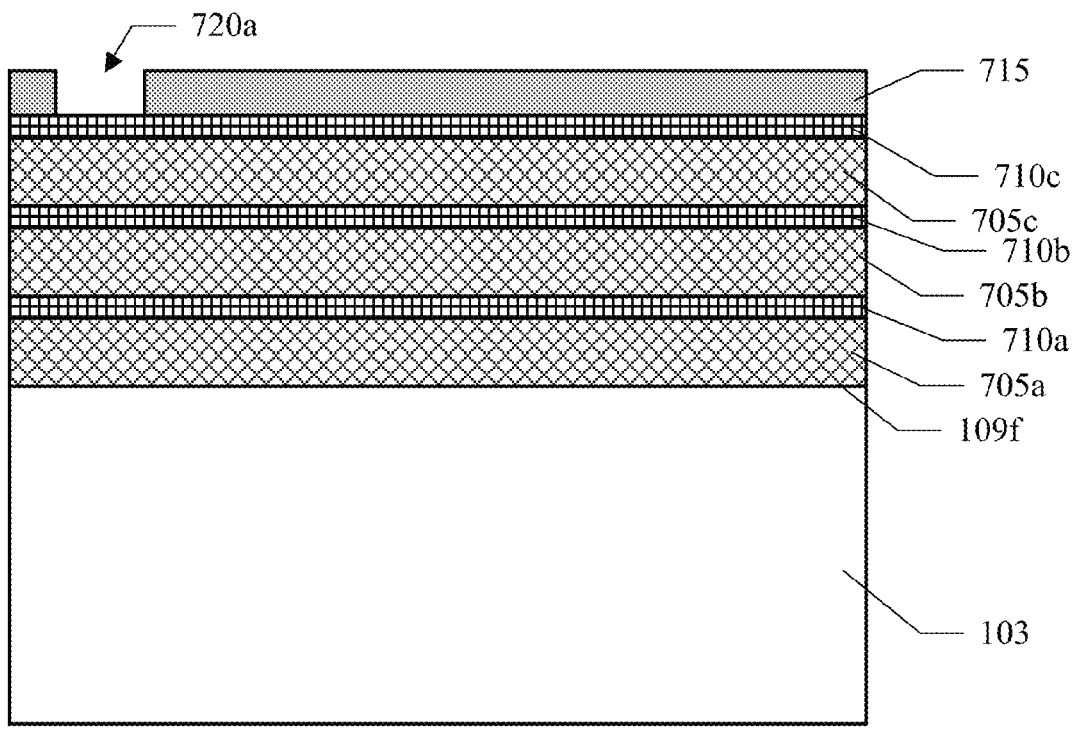
FIGS. 7A-7Q show the main steps of a manufacturing process of an electronic device according to an embodiment of the present disclosure.
Figure 7B:
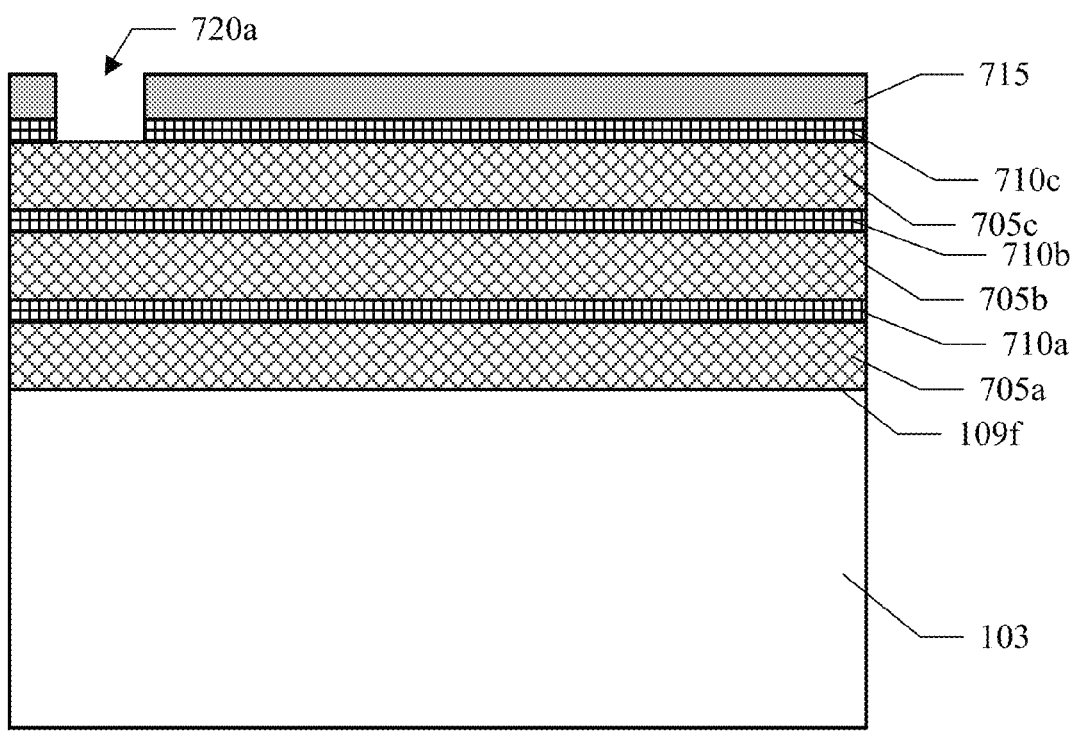
Figure 7C:
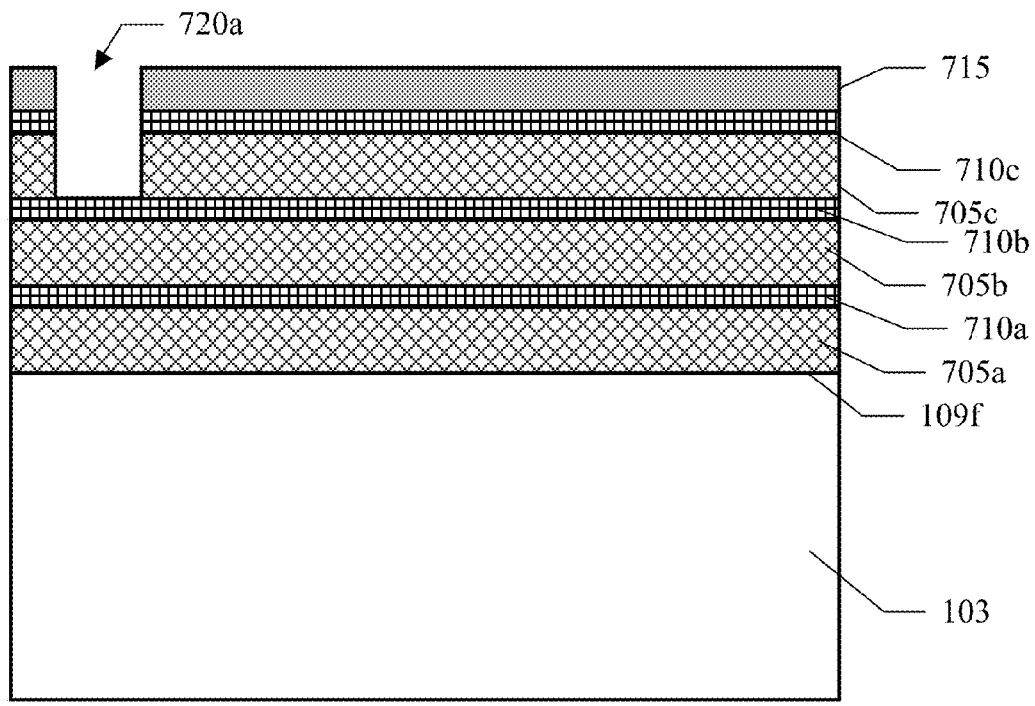
Figure 7D:
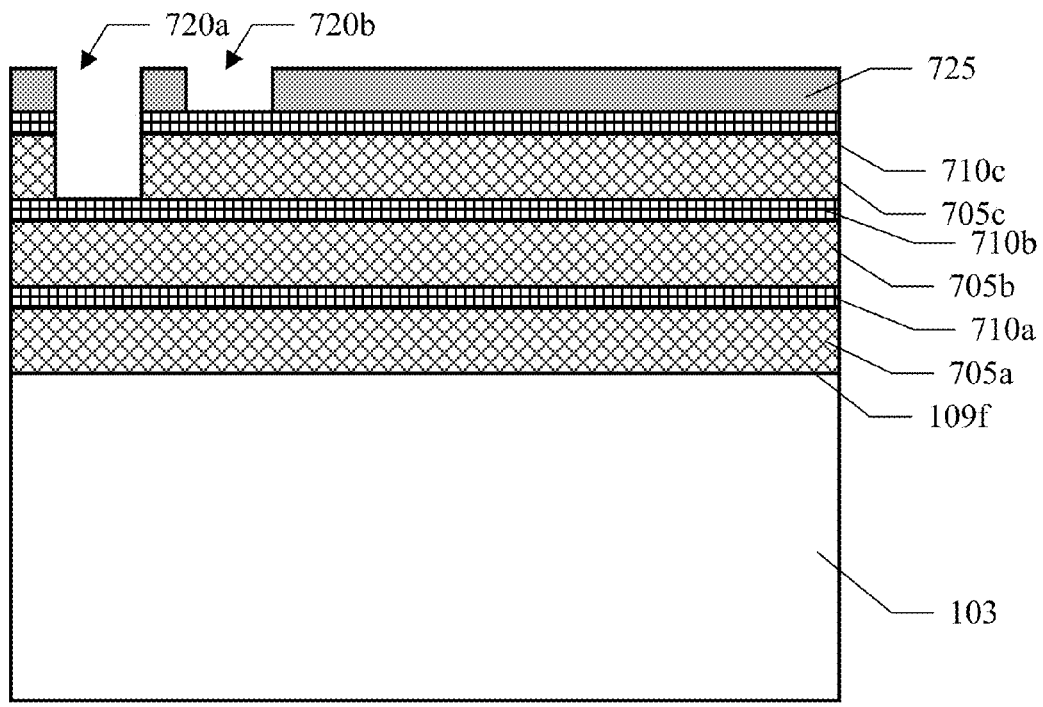
Figure 7E:
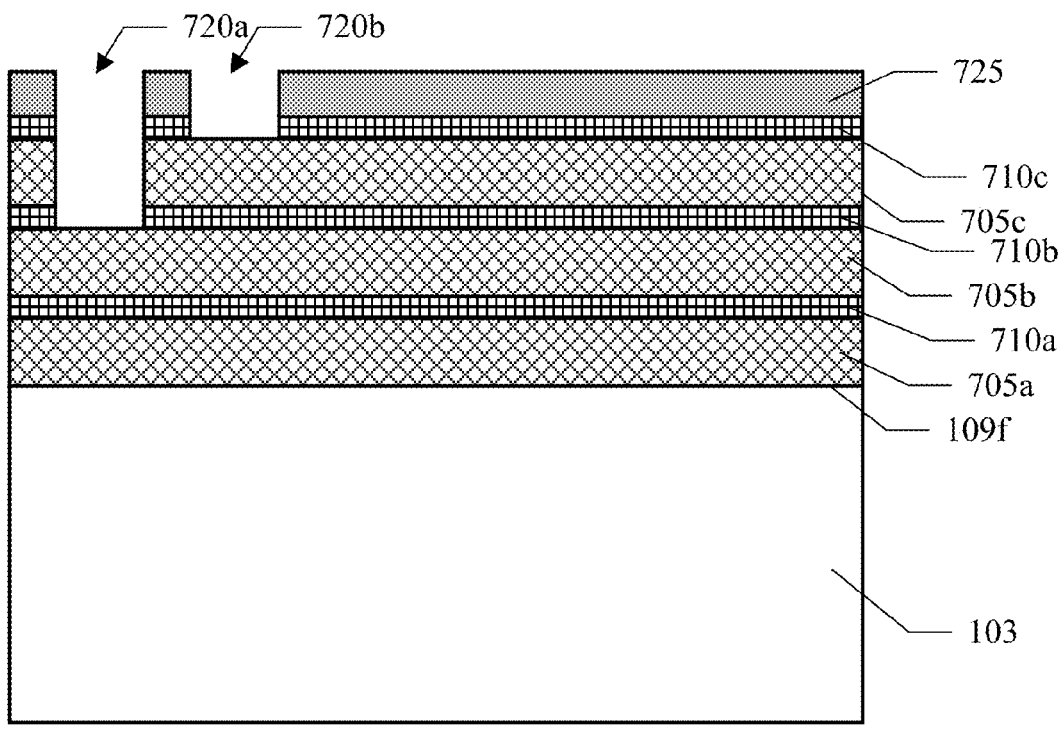
Figure 7F:
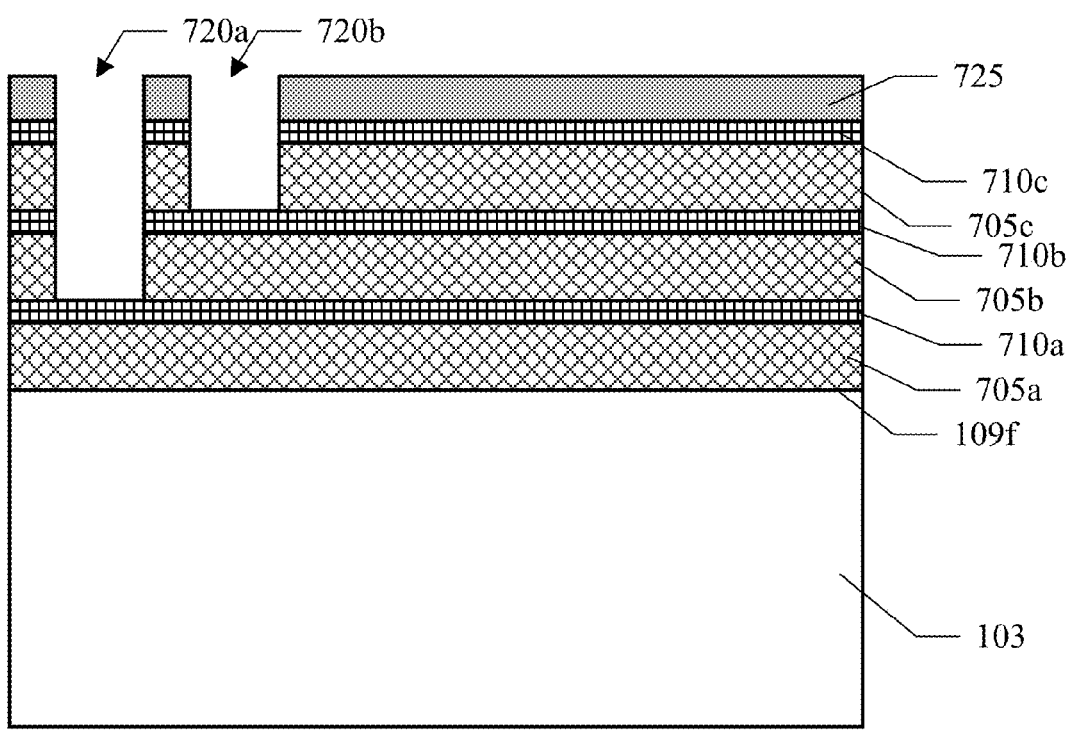
Figure 7G:
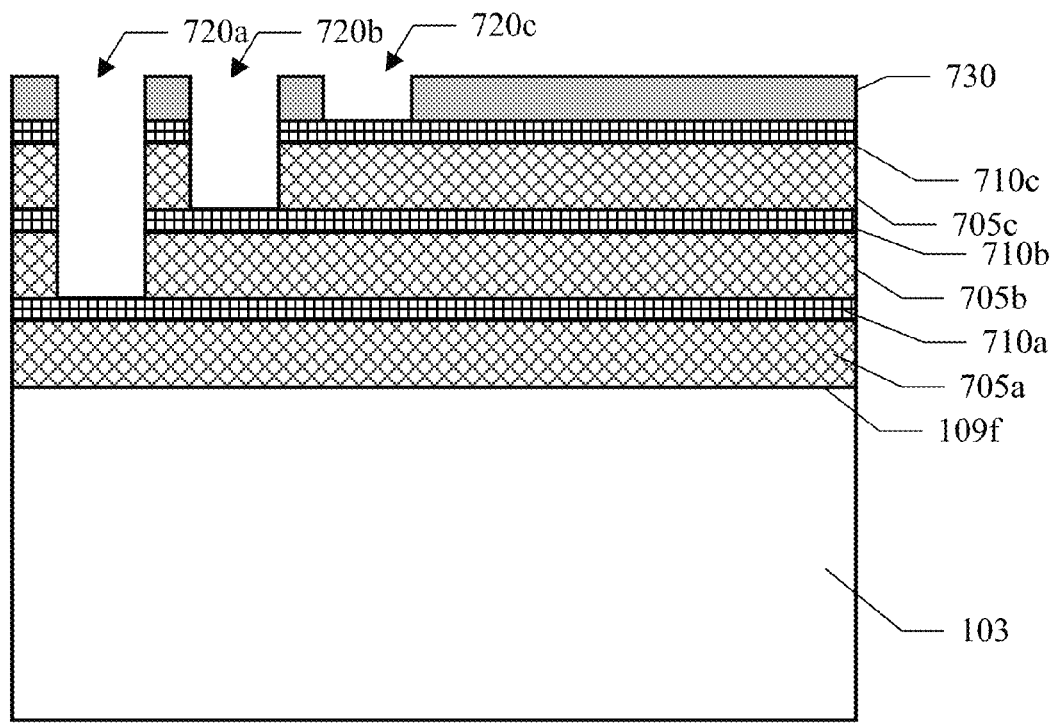
Figure 7H:
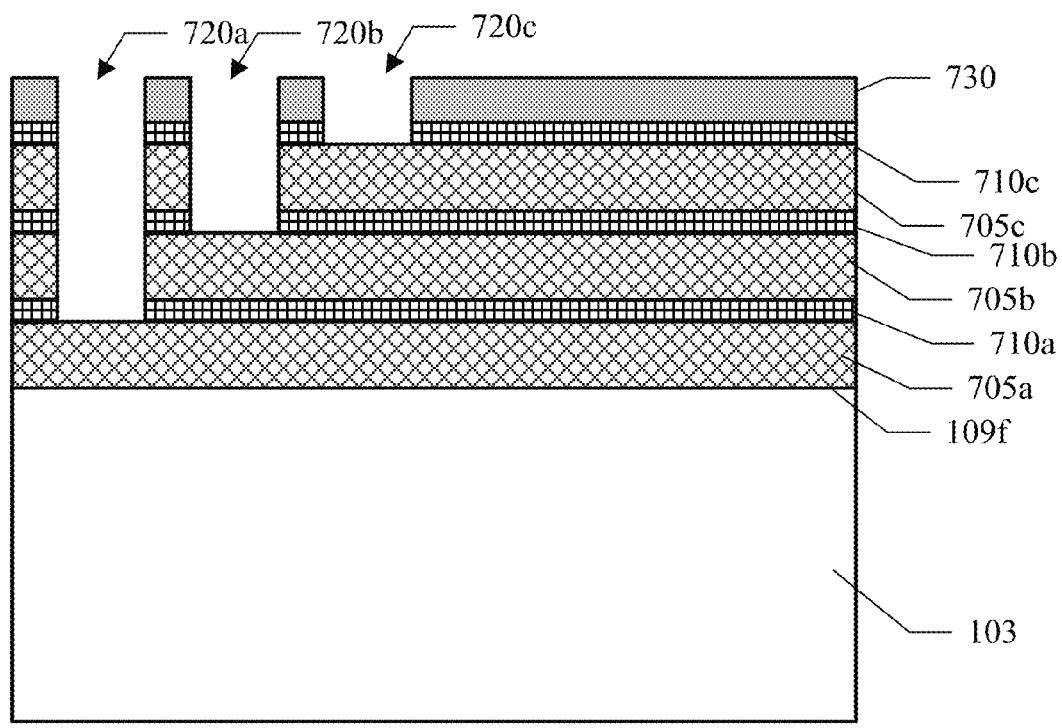
Figure 7I:
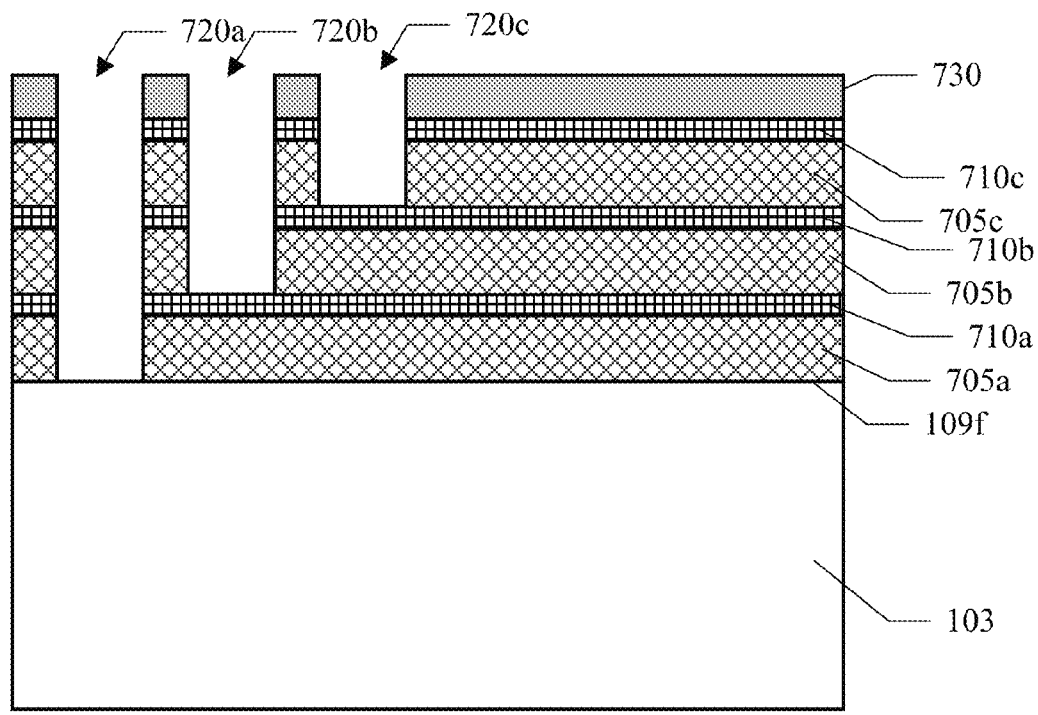
Figure 7J:
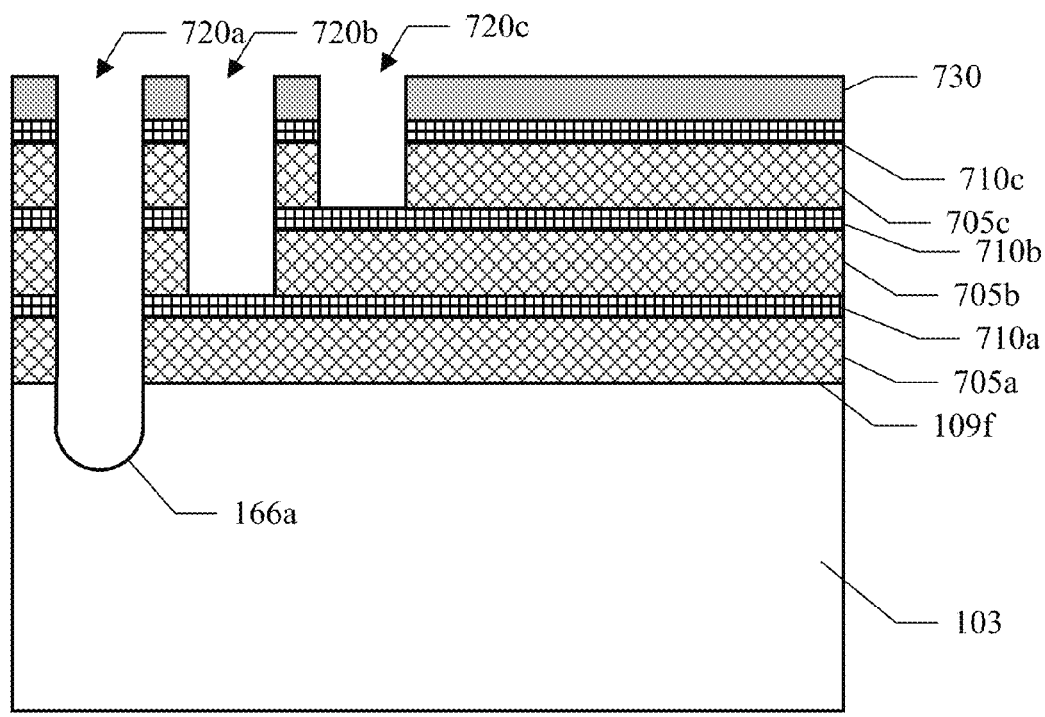
Figure 7K:
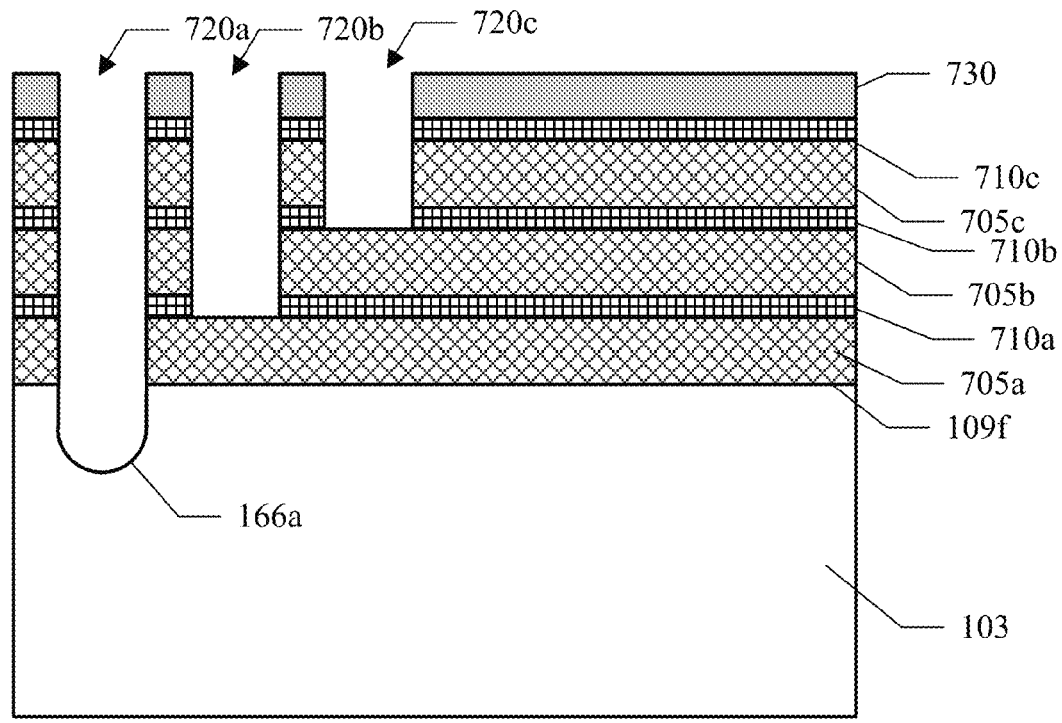
Figure 7L:
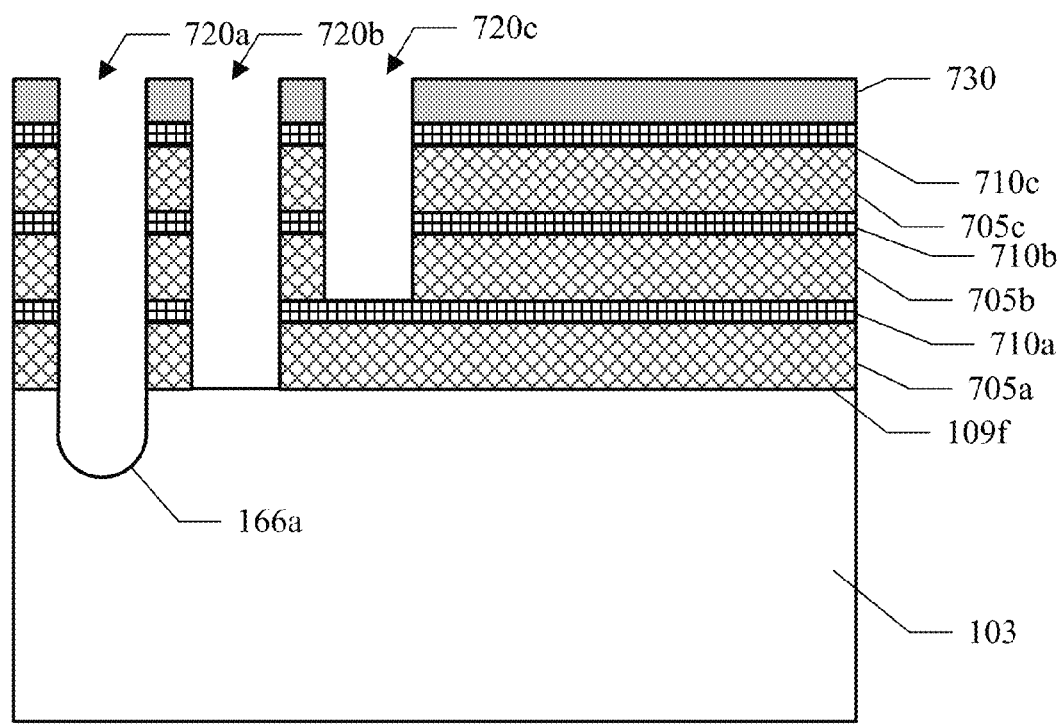
Figure 7M:
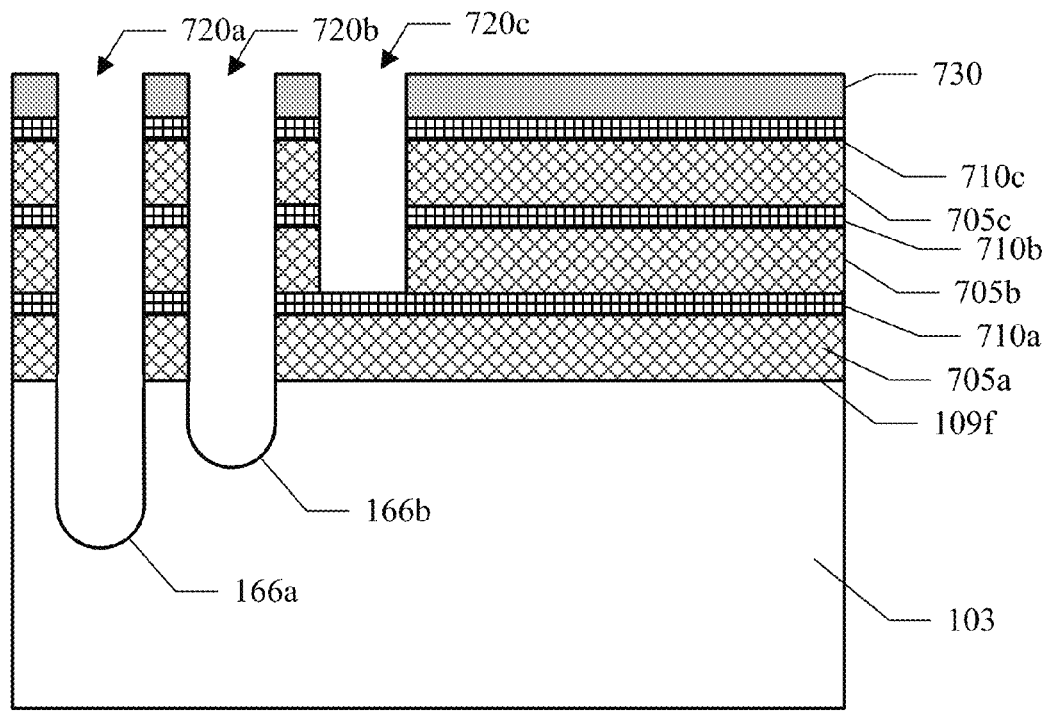
Figure 7N:
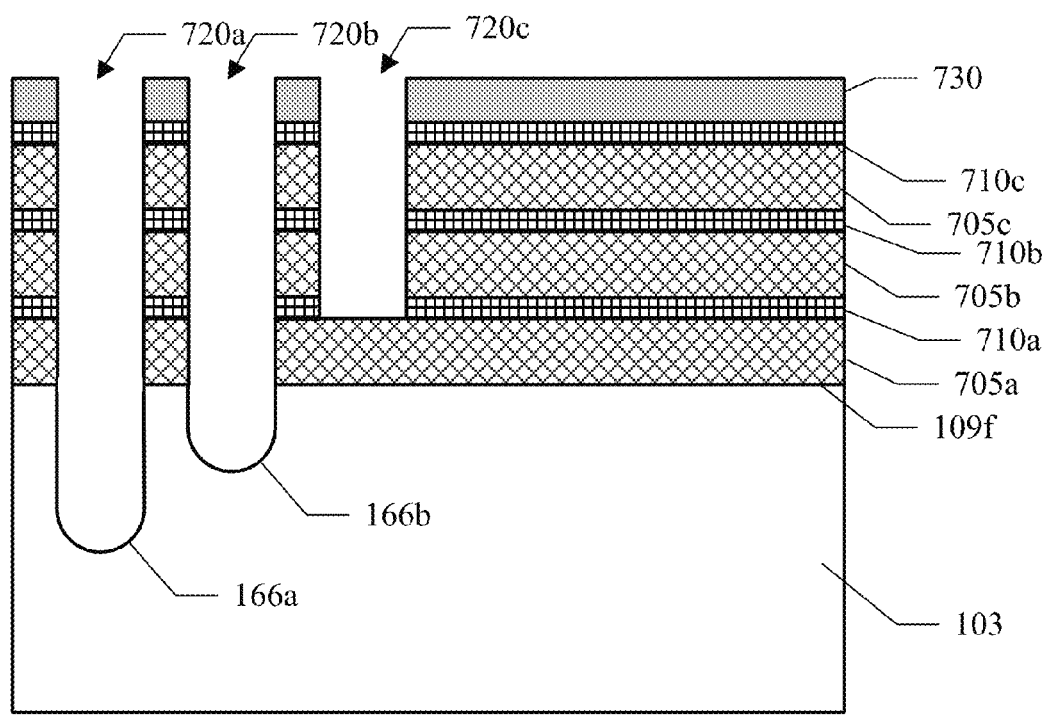
Figure 7O:
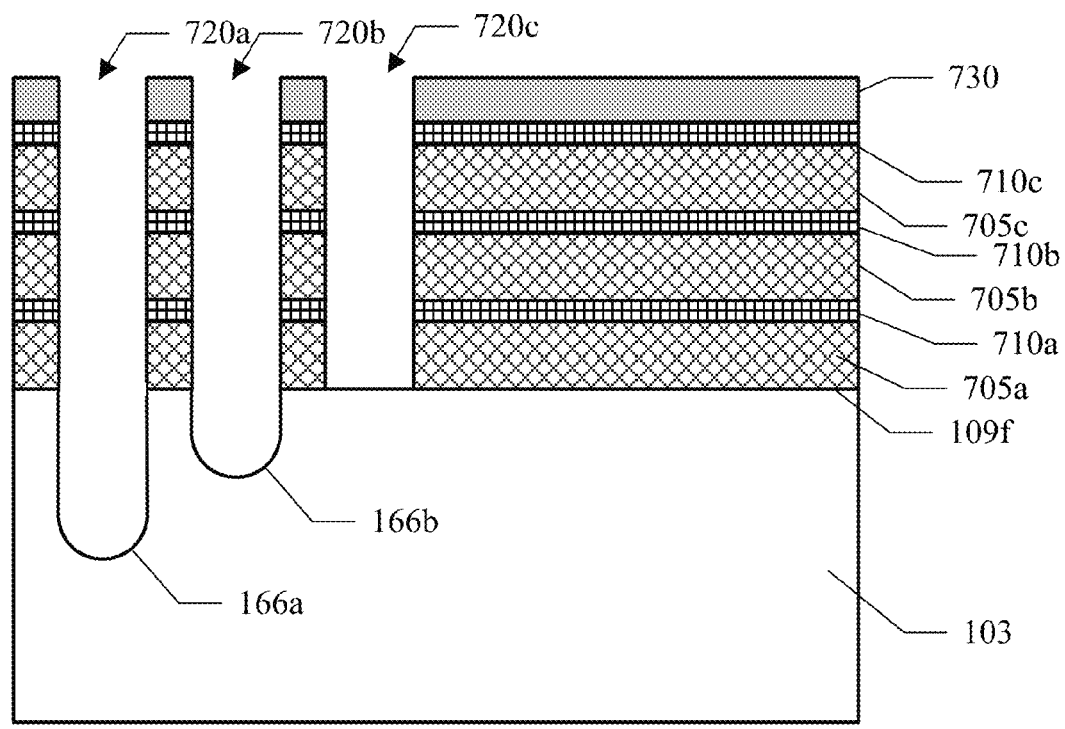
Figure 7P:
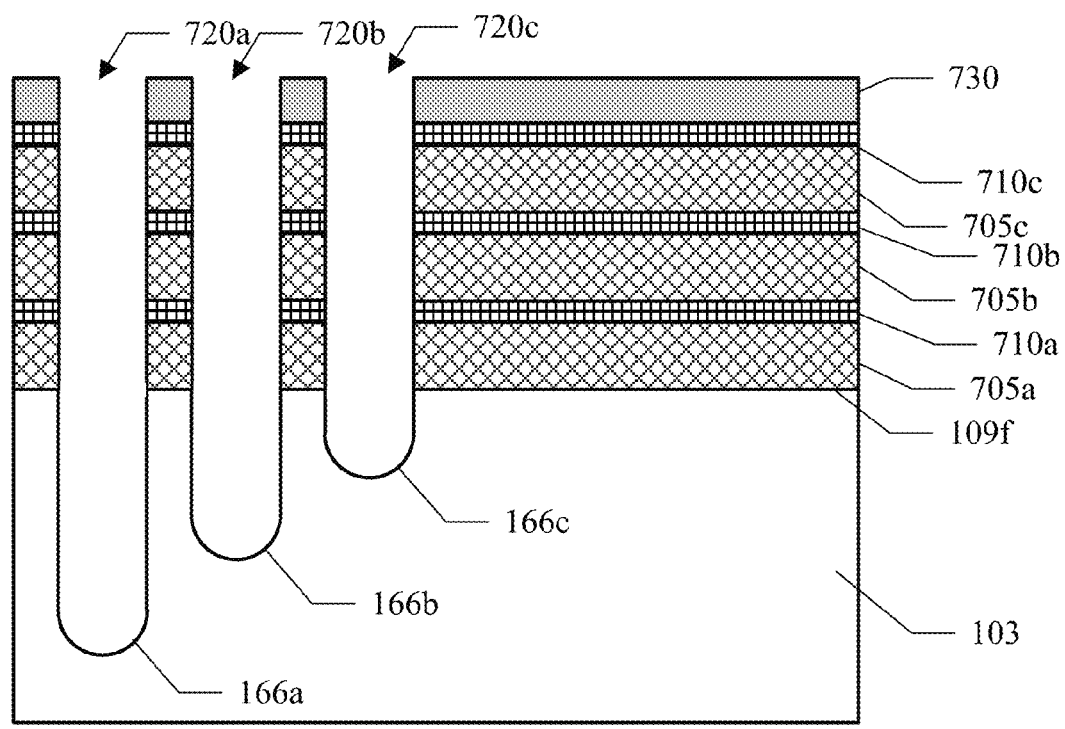
Figure 7Q:
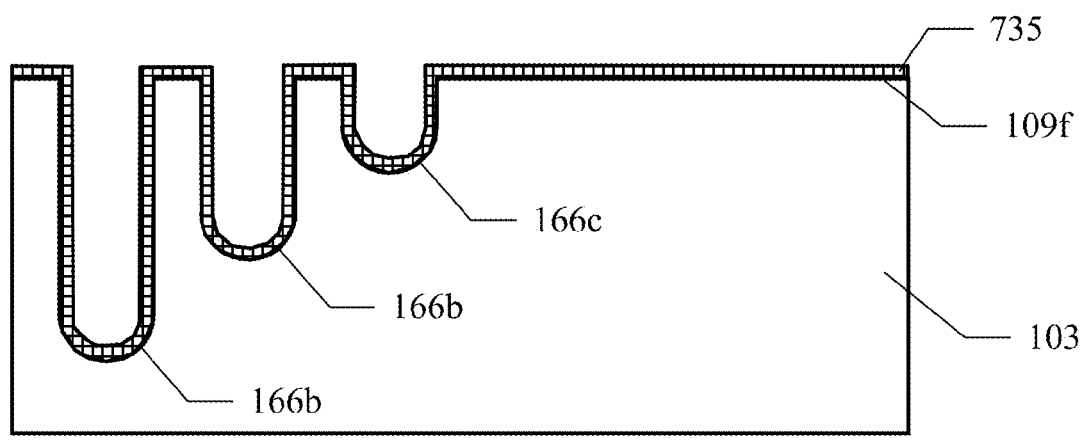

With reference now to FIGS. 7A-7Q, they show the main steps of a manufacturing process of an electronic device according to an embodiment of the present disclosure. Particularly, the figures relate to the phases relevant to make the termination trenches; the same operations may also be used to make the gate trenches (not shown in the figures) in the active area, for example, with additional operations if they are deeper and simultaneously to the first termination trench if they have the same depth.

Generally, the manufacturing process is performed at the level of a wafer of semiconductor material, wherein the same structure is integrated simultaneously in a large number of identical areas thereof; at the end of the manufacturing process, these areas of the wafer are separated in corresponding chips by a sawing operation (for simplicity of description, however, in the following reference will be made only to one of these chips).

Starting from FIG. 7A, a stack of masking layers (hardmasks) superimposed one to another are formed on the surface 109f of the chip 103, in the same number of the termination rings (with the chip 103 that may already comprise the edge ring, not shown in the figure, or not, for example, previously constructed by a global implantation and diffusion operation); each masking layer is in turn formed by two masking, non-conductive, sub-layers of different materials superimposed to each other. For example, on the surface 109f three masking layers are deposited, each one comprising a (bottom) TEOS layer 705a-705c and an (upper) Nitride layer 710a-710c. A photo-resist layer 715 is deposited on the (uppermost) Nitride layer 710c. A window 720a is opened in the photo-resist layer 715 in correspondence to the (innermost) first termination trench, with standard photo-lithographic techniques (based on corresponding photo-lithographic masks).

Turning to FIG. 7B, a portion of the Nitride layer 710c (exposed through the window 720a) is removed by an etching operation. The etching operation is dry and performed with a gas mixture that is selective for the Nitride with respect to the TEOS, such as $CF_4$ (or $NF_3$) with the addition of Ar, $O_2$ and $N_2$ (for example, with a ratio between an etching rate of the Nitride and an etching rate of the TEOS higher than 10-100). The etching operation has a length such as to ensure the removal of the Nitride layer 710c for all its thickness; however, the selectivity of the etching with respect to the TEOS ensures that the underlying TEOS layer 705c act as a stop-layer, so as to block the etching automatically once it has been reached.

Turning to FIG. 7C, a portion of the TEOS layer 705c (exposed through the window 720a) is removed by a different etching operation. The etching operation is dry and performed with a gas mixture that is now selective for the TEOS with respect to the Nitride, such as $CHF_3$ with the addition of $O_2$/Ar (for example, with a ratio between an etching rate of the TEOS and an etching rate of the Nitride again higher than 10-100). The etching operation has a length such as to ensure the removal of the TEOS layer 705c for all its thickness; however, the selectivity of the etching with respect to the Nitride ensures that the underlying Nitride layer 710b acts as a stop-layer, so as to block the etching automatically once it has been reached. At this point, the photo-resist layer 715 is removed.

Turning to FIG. 7D, a further photo-resist layer 725 is deposited on the structure thus obtained. The same window 720a and a further window 720b (in correspondence to the second termination trench) are opened in the photo-resist layer 725.

Turning to FIG. 7E, a portion of the Nitride layer 710b and a portion of the Nitride layer 710c (exposed through the window 720a and the window 720b, respectively) are removed by the same etching operation being selective for the Nitride, down to reach the underlying TEOS layer 705b and TEOS layer 705c, respectively.

Turning to FIG. 7F, a portion of the TEOS layer 705b and a portion of the TEOS layer 705c (exposed through the window 720a and the window 720b, respectively) are removed by the same etching operation being selective for the TEOS, down to reach the underlying Nitride layer 710a and Nitride layer 710b, respectively. At this point, the photo-resist layer 725 is removed.

Turning to FIG. 7G, a further photo-resist layer 730 is deposited on the structure thus obtained. The same windows 720a, 720b and a further window 720c (in correspondence to the third termination trench) are opened in the photo-resist layer 730.

Turning to FIG. 7H, a portion of the Nitride layer 710a, a portion of the Nitride layer 710b and a portion of the Nitride layer 710c (exposed through the window 720a, the window 720b and the window 720c, respectively) are removed by the same etching operation being selective for the Nitride, down to reach the underlying TEOS layer 705a, TEOS layer 705b and TEOS layer 705c, respectively.

Turning to FIG. 7I, a portion of the TEOS layer 705a, a portion of the TEOS layer 705b and a portion of the TEOS layer 705c (exposed through the window 720a, the window 720b and the window 720c, respectively) are removed by the same etching operation being selective for the TEOS, down to reach the underlying chip 103, Nitride layer 710a and Nitride layer 710b, respectively.

Turning to FIG. 7J, a portion of the chip 103 (exposed through the window 720a) is removed through a different etching operation. The etching operation is dry and performed with a gas mixture that is selective for the silicon with respect to the TEOS and the Nitride, such as $CF_4$ with the addition of Ar (for example, with a ratio between an etching rate of the silicon and an etching rate of the TEOS/Nitride again higher than 10-100). The etching operation has a length corresponding to a depth difference between the first termination trench and the second termination trench, so as to start digging the first termination trench 166a to such a depth (without any substantial etching neither of the Nitride layer 710a nor of the Nitride layer 710b exposed through the window 720b and the window 720c, respectively).

Turning to FIG. 7K, a portion of the Nitride layer 710a and a portion of the Nitride layer 710b (exposed through the window 720b and the window 720c, respectively) are removed by the same etching operation being selective for the Nitride, down to reach the underlying TEOS layer 705a and TEOS layer 705b, respectively (without any substantial etching of the chip 103 exposed through the window 720a).

Turning to FIG. 7L, a portion of the TEOS layer 705a and a portion of the TEOS layer 705b (exposed through the window 720b and the window 720c, respectively) are removed by the same etching operation being selective for the TEOS, down to reach the underlying chip 103 (acting as stop-layer as well) and Nitride layer 710a, respectively (without any substantial etching of the chip 103 exposed through the window 720a).

Turning to FIG. 7M, a portion of the chip 103 (exposed through the window 720a and the window 720b) is removed by the same etching operation being selective for silicon. The etching operation has a length corresponding to a depth difference between the second termination trench and the third termination trench, so as to continue digging the first termination trench 166a and to begin digging the second termination trench 166b to such as depth (without any substantial etching of the Nitride layer 710a exposed through the window 720c).

Turning to FIG. 7N, a portion of the Nitride layer 710a (exposed through the window 720c) is removed by the same etching operation being selective for the Nitride, down to reach the TEOS layer 705a (without any substantial etching of the chip 103 exposed through the windows 720a and 720b).

Turning to FIG. 7O, a portion of the TEOS layer 705a (exposed through the window 720c) is removed by the same etching operation being selective for the TEOS, down to reach the underlying chip 103 (without any substantial etching of the chip 103 exposed through the window 720a and the window 720b).

Turning to FIG. 7P, a portion of the chip 103 (exposed through the window 720a, the window 720b and the window 720b) is removed by the same etching operation being selective for the silicon. The etching operation has a length corresponding to a depth of the third termination trench, so as to complete digging the first termination trench 166a and the second termination trench 166b, and to make the third termination trench 166c directly. At this point, the photo-resist layer 730, all the TEOS layers 705a-705c and all the Nitride layers 710a-710c are removed.

Turning to FIG. 7Q, an oxide layer 735 is grown (or deposited) on the structure thus obtained (with the possibility at this point of selectively implanting and diffusing the edge ring, not shown in the figure).

The production process described above allows controlling the depth of the termination trenches in a very accurate way; indeed, the deepest trenches are obtained with subsequent etching operations with limited depth (and therefore shorter and easier to control).

With reference now to FIGS. 8A-8I, they show the main steps of a manufacturing process of an electronic device according to a further embodiment of the present disclosure (always for making the termination trenches).

Figure 8A:
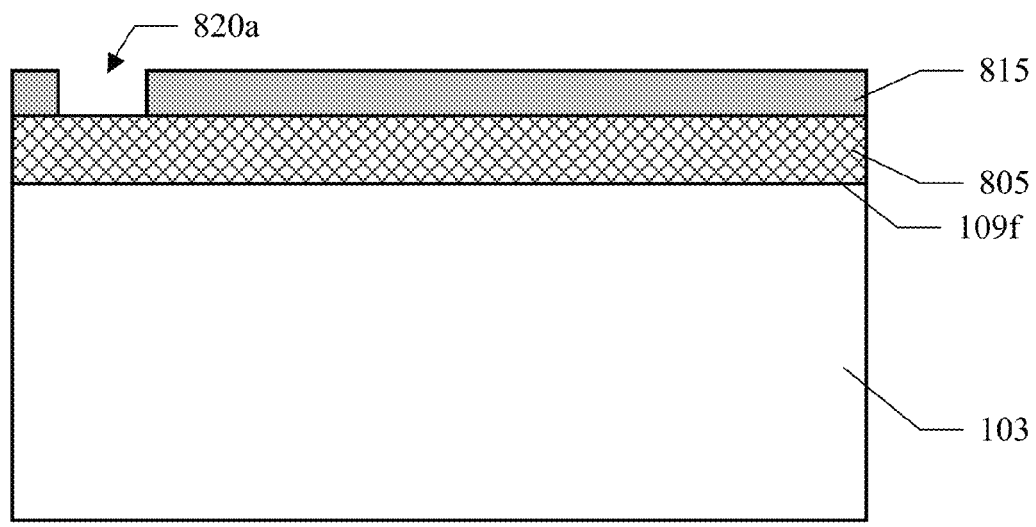
FIGS. 8A-8I show the main steps of a manufacturing process of an electronic device according to a further embodiment of the present disclosure.

Starting from FIG. 8A, a single masking layer 805 (for example, of TEOS) is formed on the surface 109f of the chip 103. A photo-resist layer 815 is deposited on the TEOS layer 805. A window 820a is opened in the photo-resist layer 815 in correspondence to the first termination trench.

Figure 8B:
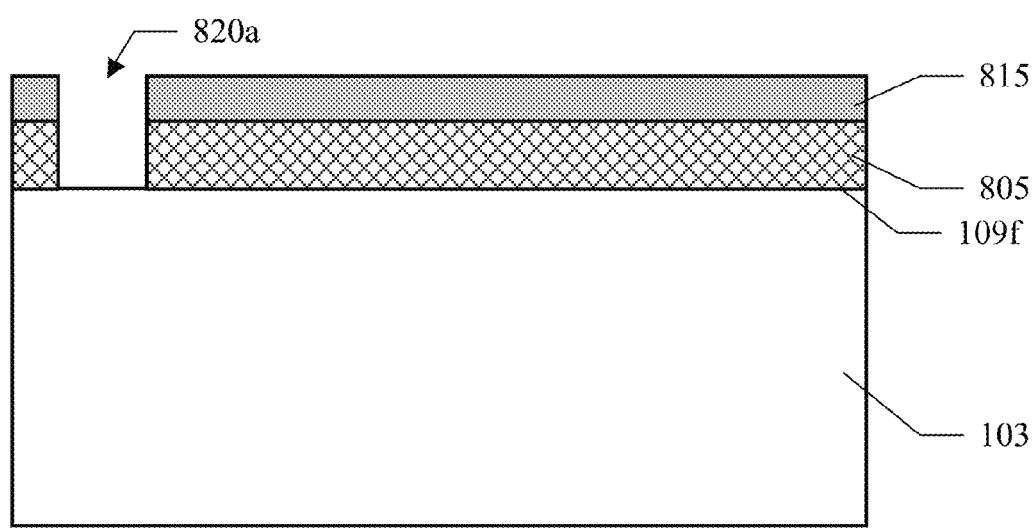

Turning to FIG. 8B, a portion of the TEOS layer 805 (exposed through the window 820a) is removed by a dry etching operation with a gas mixture that is selective for the TEOS with respect to silicon, such as $CHF_3/O_2/Ar$ (for example, with a ratio between an etching rate of the TEOS and an etching rate of the silicon higher than 10-100), down to reach the underlying chip 103 (which acts as a stop-layer).

Figure 8C:
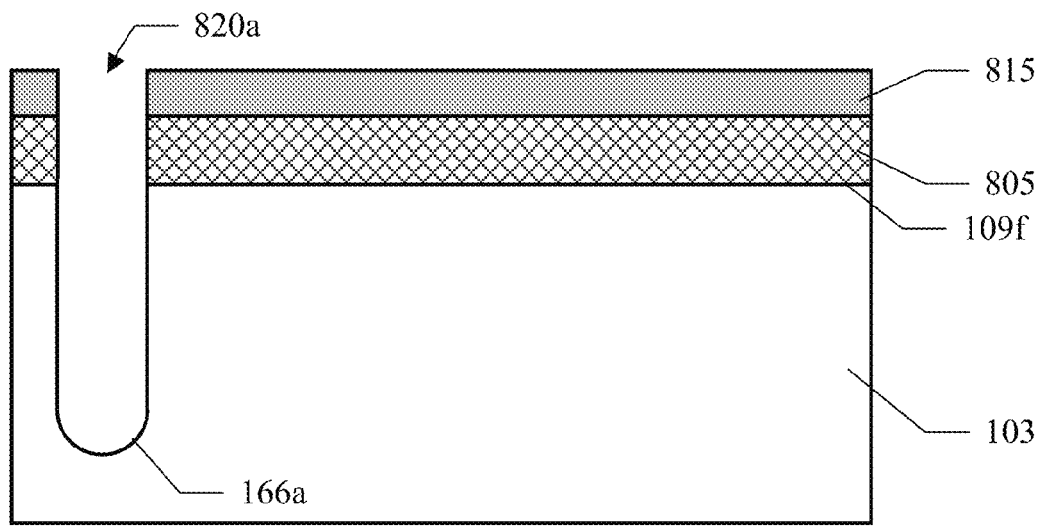

Turning to FIG. 8C, a portion of the chip 103 (exposed through the window 820a) is removed by a different dry etching operation that is effective for the silicon, such as $CF_4/O_2/Ar$. The etching operation has a length corresponding to the depth of the first termination trench 166a that is then dug completely. At this point, the photo-resist layer 815 is removed.

Figure 8D:
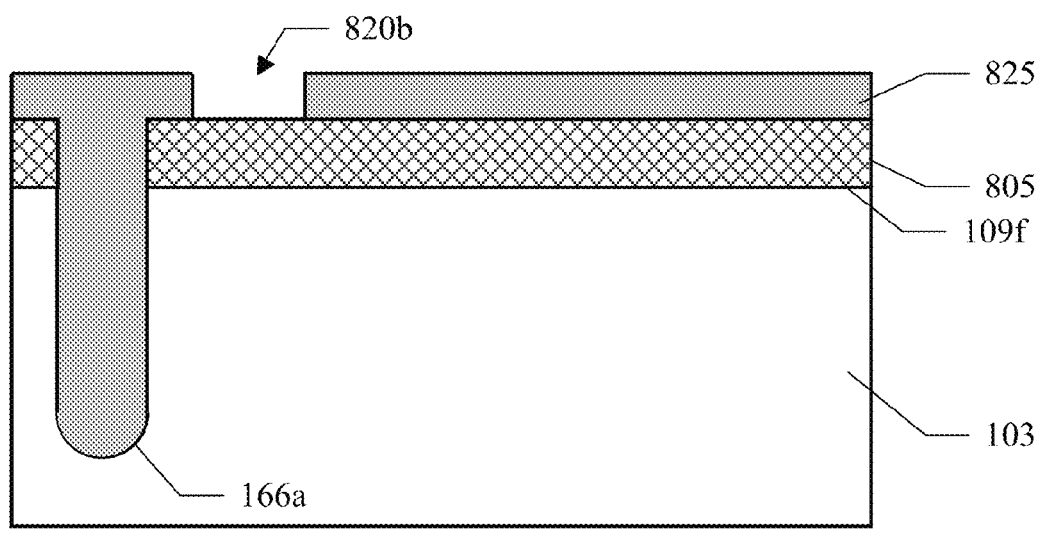

Turning to FIG. 8D, a further photo-resist layer 825 is deposited on the structure thus obtained (thereby filling the termination trench 166a). A window 820b is opened in the photo-resist layer 825 in correspondence to the second termination trench.

Figure 8E:
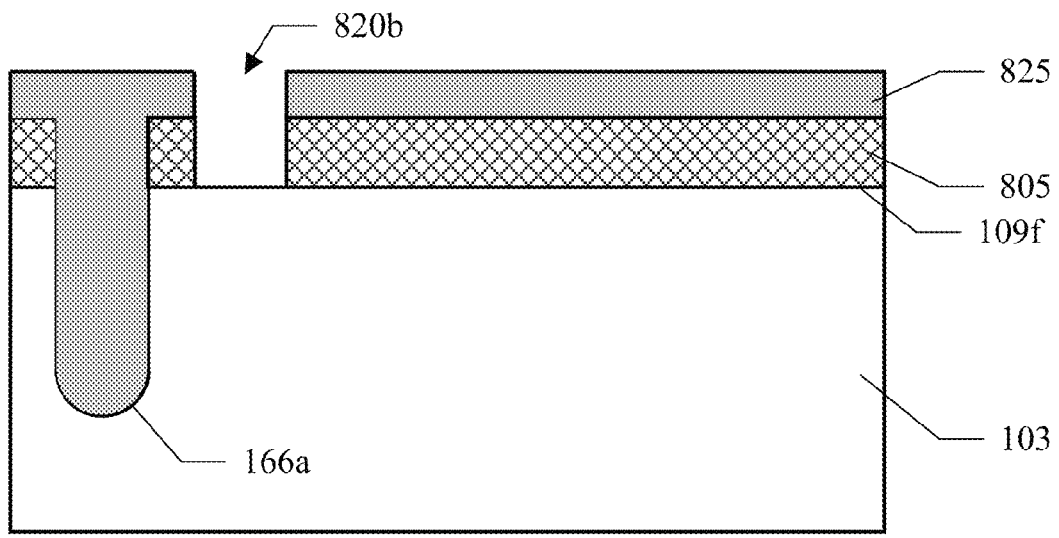

Turning to FIG. 8E, a portion of the TEOS layer 805 (exposed through the window 820b) is removed by the same etching operation being selective for the TEOS, down to reach the underlying chip 103.

Figure 8F:
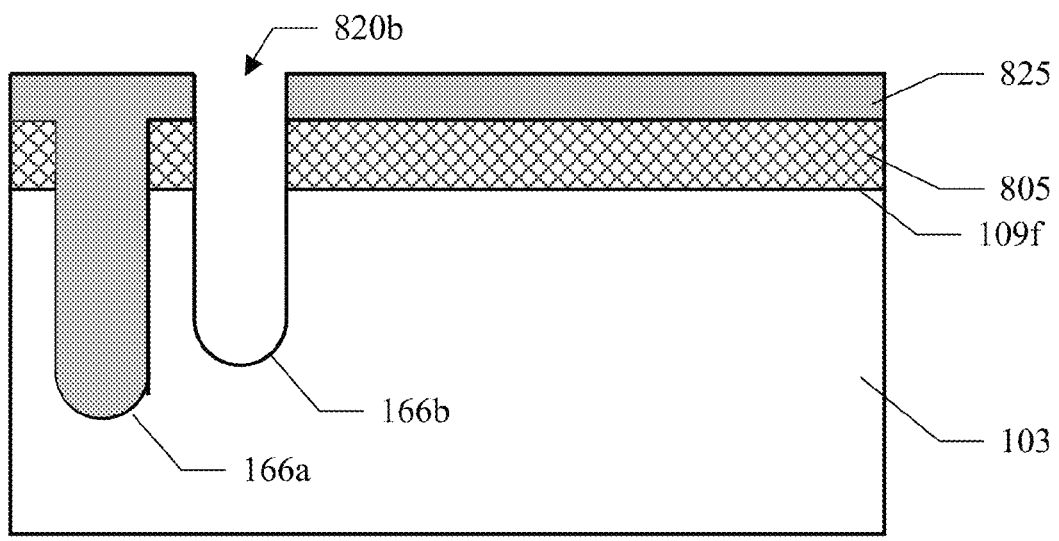

Turning to FIG. 8F, a portion of the chip 103 (exposed through the window 820b) is removed by the same etching operation being effective for the silicon. The etching operation has a length corresponding to the depth of the second termination trench 166b that is then dug completely. At this point, the photo-resist layer 825 is removed.

Figure 8G:
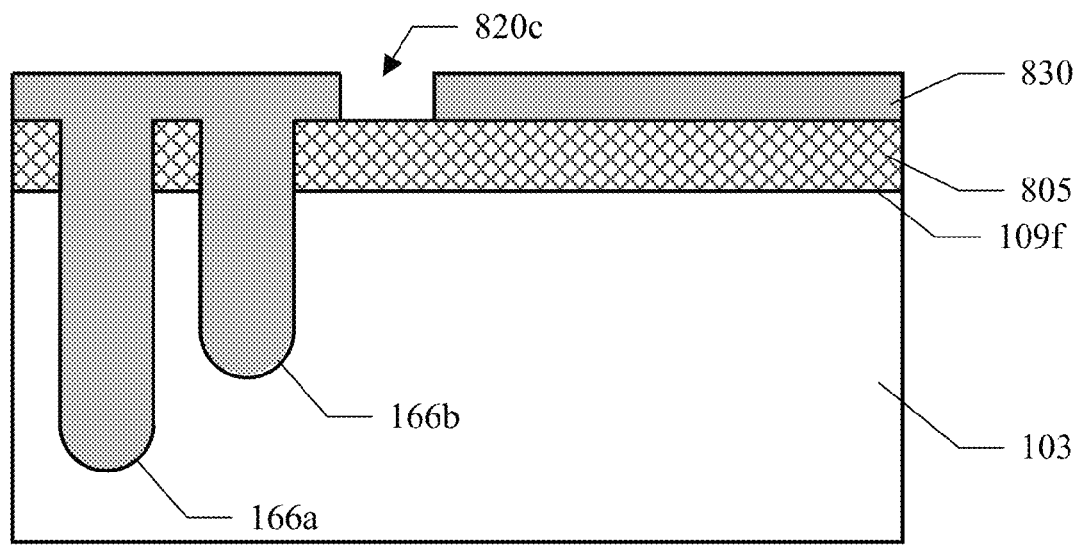

Turning to FIG. 8G, a further photo-resist layer 830 is deposited on the structure thus obtained (thereby filling the termination trench 166a and the termination trench 166b). A window 820c is opened in the photo-resist layer 830 in correspondence to the third termination trench.

Figure 8H:
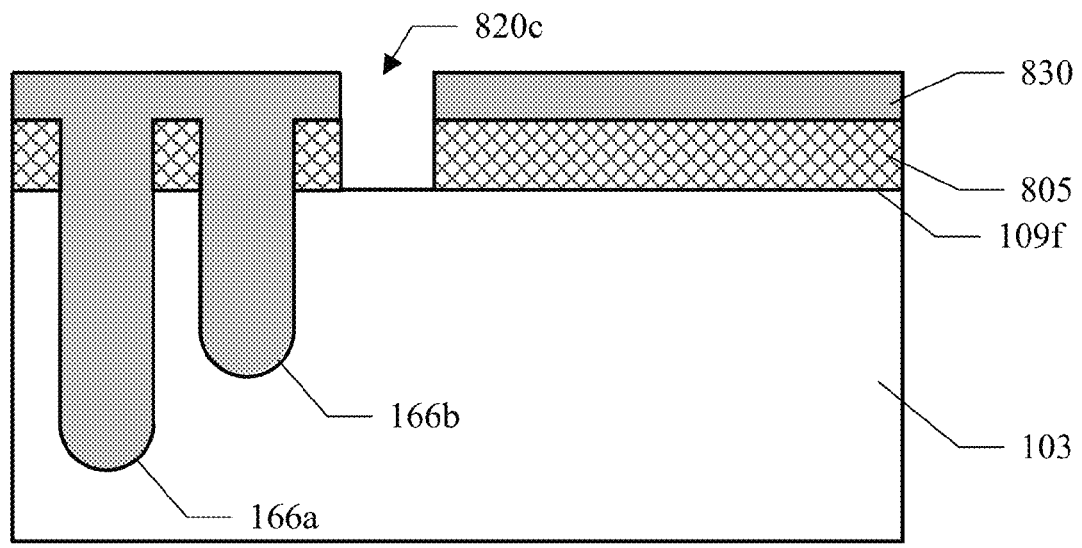

Turning to FIG. 8H, a portion of the TEOS layer 805 (exposed through the window 820c) is removed by the same etching operation being selective for the TEOS, down to reach the underlying chip 103.

Figure 8I:
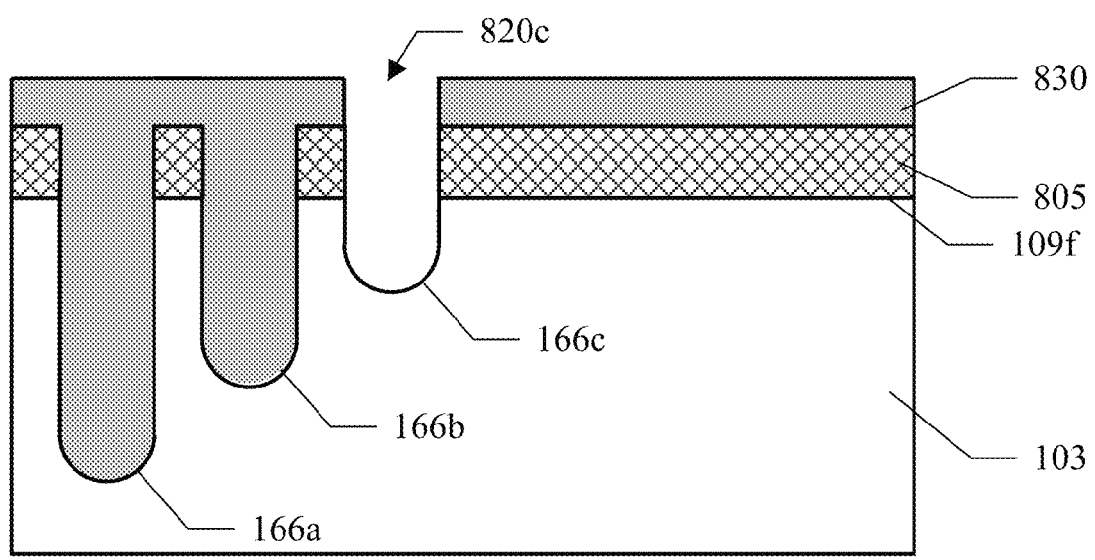

Turning to FIG. 8I, a portion of the chip 103 (exposed through the window 820c) is removed by the same etching operation being effective for the silicon. The etching operation has a length corresponding to the depth of the third termination trench 166c that is then dug completely. At this point, the photo-resist layer 825 and the TEOS layer 805 are removed, and an oxide layer is grown (or deposited) on the structure thus obtained so as to obtain the same result as above.

The manufacturing process described above requires a reduced number of steps.

Figure 9A:
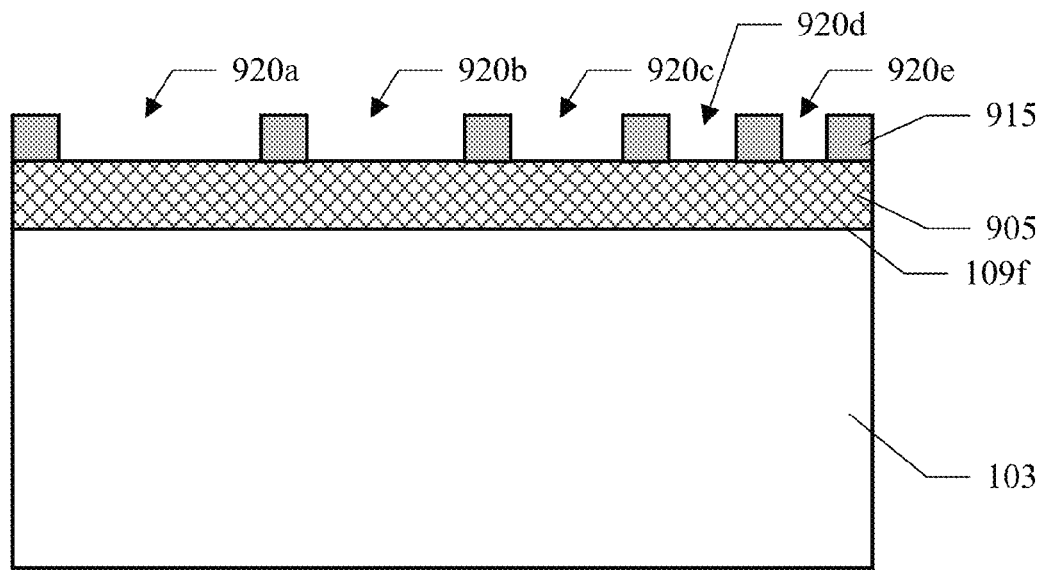
FIGS. 9A-9C show the main steps of a manufacturing process of an electronic device according to a further embodiment of the present disclosure.
Figure 9B:
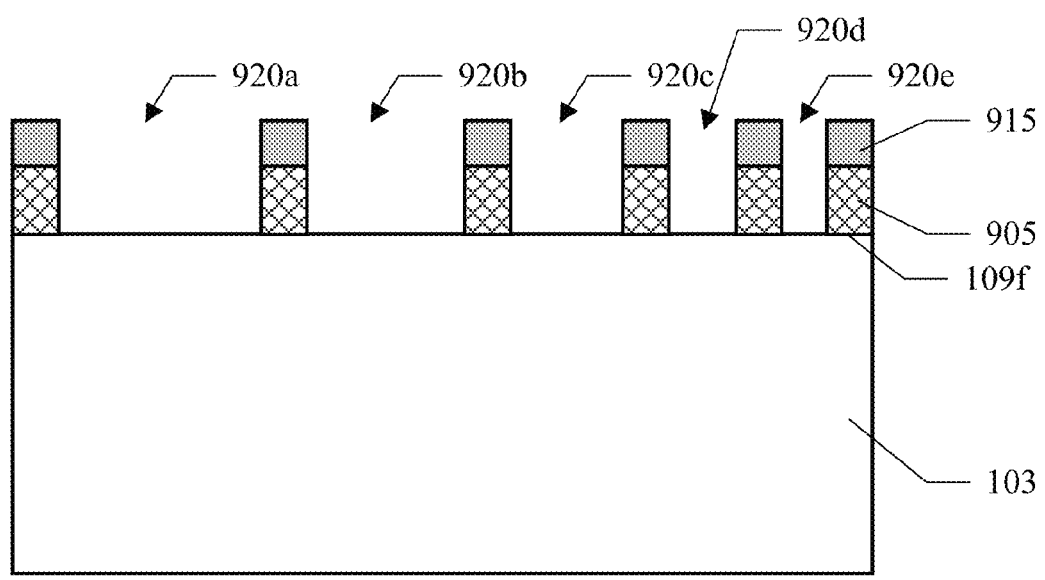
Figure 9C:
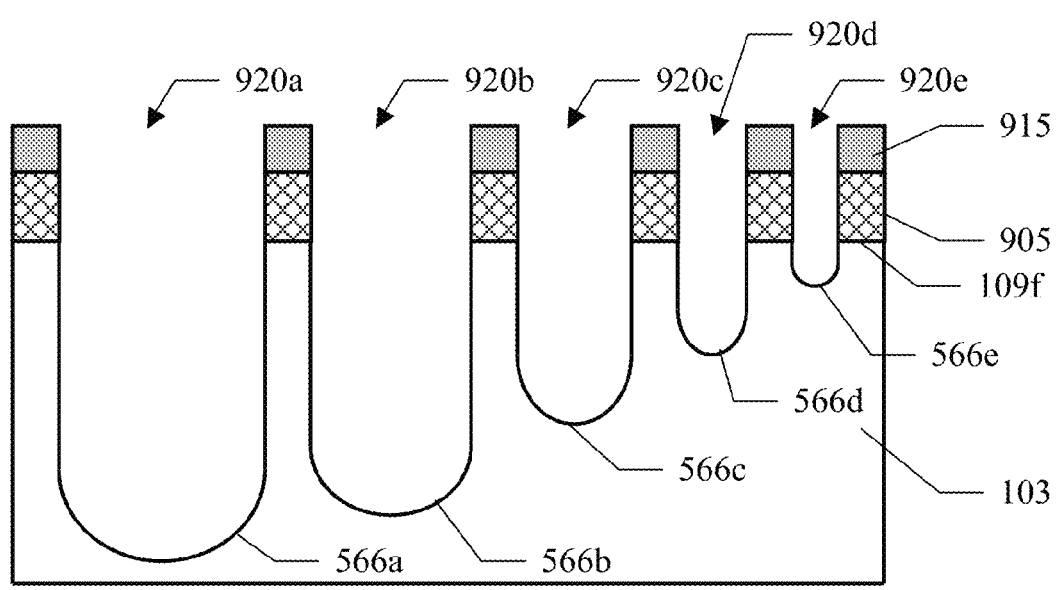

With reference now to FIGS. 9A-9C, they show the main steps of a manufacturing process of an electronic device according to a further embodiment of the present disclosure (always for making the termination trenches, but now with variable width).

Starting from FIG. 9A, a single masking layer 905 (for example, of TEOS) is formed on the surface 109f of the chip 103. A photo-resist layer 915 is deposited on the TEOS layer 905. A plurality of windows (five in the example at issue, denoted with the references 920a-920e) are opened in the photo-resist layer 915, each one in correspondence to one of the termination trenches. The windows 920a-920e have a width corresponding to the width (and depth) of their termination trenches.

Turning to FIG. 9B, a portion of the TEOS layer 905 (exposed through the windows 920a-920e) is removed by an etching operation that is selective for the TEOS with respect to the silicon (for example, as above), down to reach the underlying chip 103.

Turning to FIG. 9C, a portion of the chip 103 (exposed through the windows 920a-920e) is removed by an etching operation that is effective for the silicon (for example, as above). The etching operation has a length corresponding to the depth of the termination trenches 566a-566e that are then dug completely. Particularly, the depth of the termination trenches 166a-166e is defined by the relation:

$$\frac{1}{D} = \frac{1}{A \cdot W} + \frac{1}{R \cdot t},$$

wherein D is the depth, A is an aspect ratio, W is the width, R is an etching rate, and t is the etching time (for example, as described in "Oh, Jae-Keun K., A new junction termination method employing shallow trenches filled with oxide, Electron Device Letters, IEEE, Jan. 2004, Volume: 25, Issue: 1 Page(s) 16-18", the entire disclosure of which is herein incorporated by reference). For example, with an etching rate R=61.2 nm/s and an aspect ratio A=6.9, it is possible to obtain a depth of about 2 μm, 4 μm, 5 μm and 6 μm with widths of about 0.25 μm, 0.5 μm, 1 μm and 0.75 μm, respectively, with an etching time t=750 s.

At this point, the photo-resist layer 915 and the TEOS layer 905 are removed, and an oxide layer is grown (or deposited) on the structure thus obtained so as to obtain a similar result as above.

The manufacturing process described above requires a single etching operation (with a single photo-lithographic mask).

Figure 10:
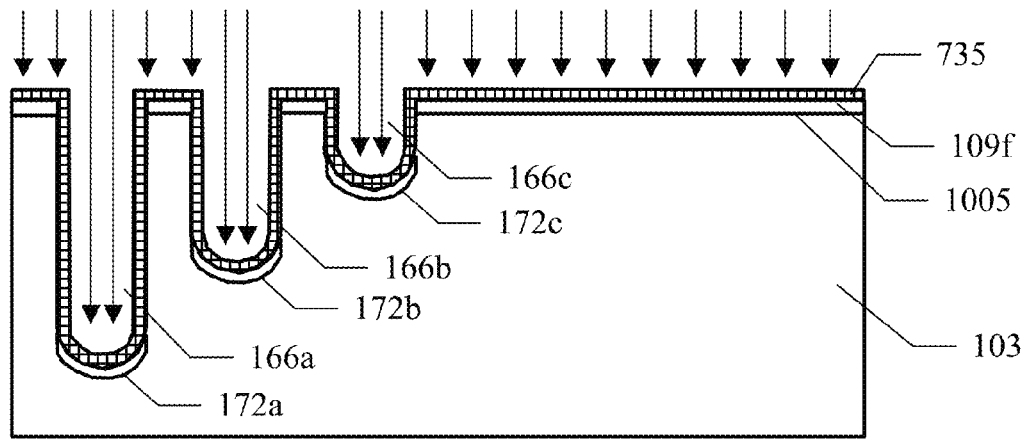
FIG. 10 shows an additional step of a manufacturing process of an electronic device according to an embodiment of the present disclosure.

With reference now to FIG. 10 an additional step is shown of a manufacturing process of an electronic device according to an embodiment of the present disclosure. Particularly, the figure relates to the phase relevant for making the bottom regions 172a-172c (starting from the termination trenches obtained in any way and with the edge ring, not shown in the figure, which may already have been made previously or it may be made simultaneously or subsequently to the making of the bottom regions 172a-172c).

Particularly, a ion implantation operation is performed along a single implantation direction perpendicular to the surface 109f, so as to obtain a P-type layer 1005, which starts making the edge ring and the body region (not shown in the figure) and completely makes the bottom regions 172a-172c (under the termination trenches 166a-166c); in this case, the bottom regions 172a-172c are made only in correspondence to a bottom portion of the termination trenches 166a-166c and they are separated by the P-type layer 1005.

Figure 11:
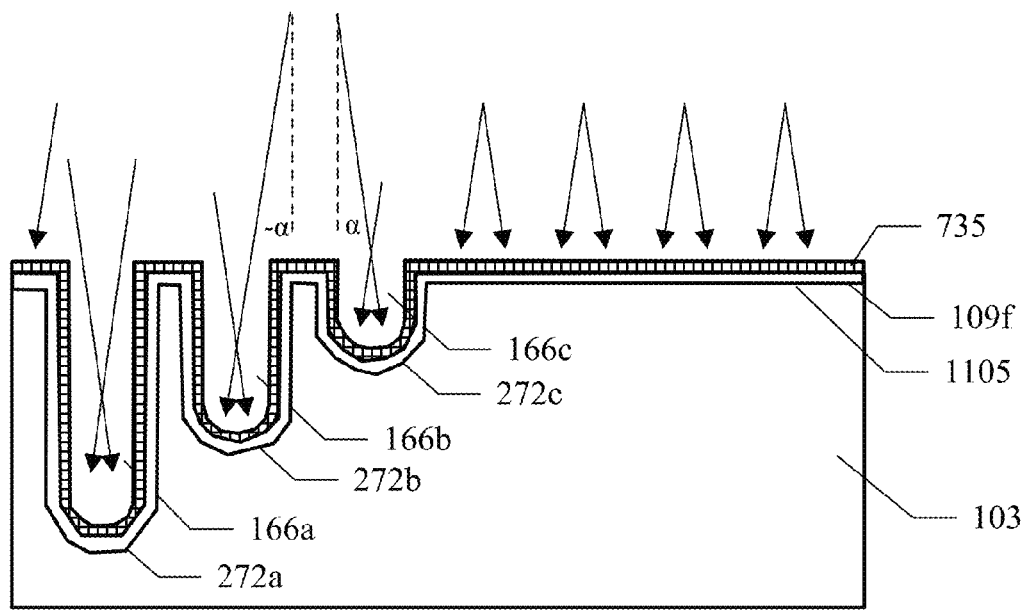
FIG. 11 shows an additional step of a manufacturing process of an electronic device according to a further embodiment of the present disclosure.

With reference now to FIG. 11 an additional step is shown of a manufacturing process of an electronic device according to a further embodiment of the present disclosure (always for making the bottom regions).

Particularly, multiple ion implantation operations are performed along at least two implantation directions being inclined with respect to the surface 109f; for example, the implantation directions form, with a straight line perpendicular to the surface 109f, an angle $\pm\alpha=10°-40°$, preferably $\pm\alpha=15°-35°$, and still more preferably $\pm\alpha=20°-30°$, such as $\pm\alpha=25°$. As a consequence, there is obtained a P-type layer 1105, which starts making the edge ring and the body region (not shown in the figure) and completely makes the bottom regions 272a-272c (around the termination trenches 166a-166c); in this case, however, the bottom regions 272a-272c extend from the entire surface of the termination trenches 166a-166c and they are connected to the P-type layer 1105.

With reference now to FIGS. 12A-12F, the main additional steps are shown of a manufacturing process of an electronic device according to an embodiment of the present disclosure. Particularly, the figures relate to the relevant steps for completing the termination structure (starting from the termination trenches and the bottom regions obtained in any way). In particular, in the following reference will be made to the bottom regions being separated from the edge ring (similar considerations apply in case the bottom regions are connected to the edge ring).

Figure 12A:
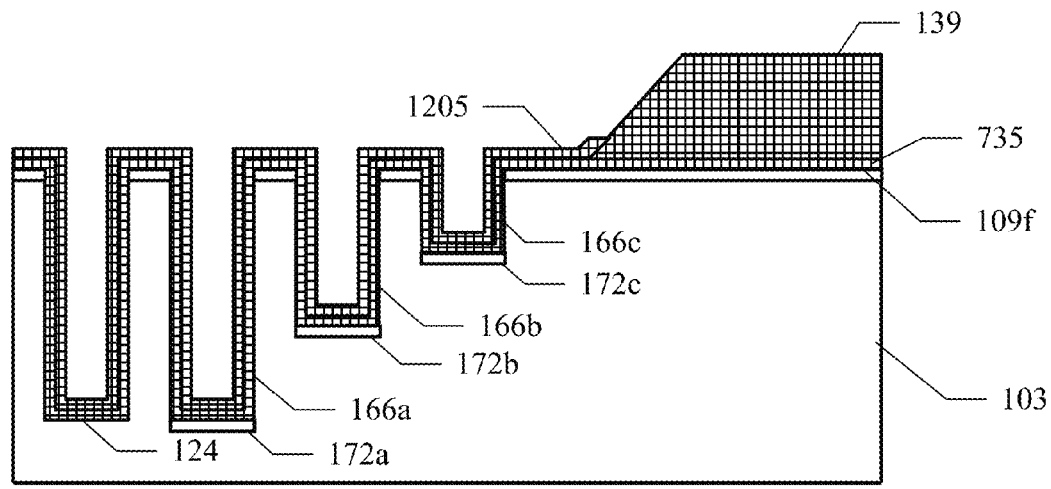
FIGS. 12A-12F show the main additional steps of a manufacturing process of an electronic device according to an embodiment of the present disclosure.

Starting to FIG. 12A, a Nitride layer 1205 is deposited on the oxide layer 735 of the structure obtained in FIG. 10. The Nitride layer 1205 is selectively removed at the edge of the chip. The field oxide layer 139 is grown from the portion of the oxide layer 735 exposed by the Nitride layer 1205. At this point, the Nitride layer 1205 is removed.

Figure 12B:
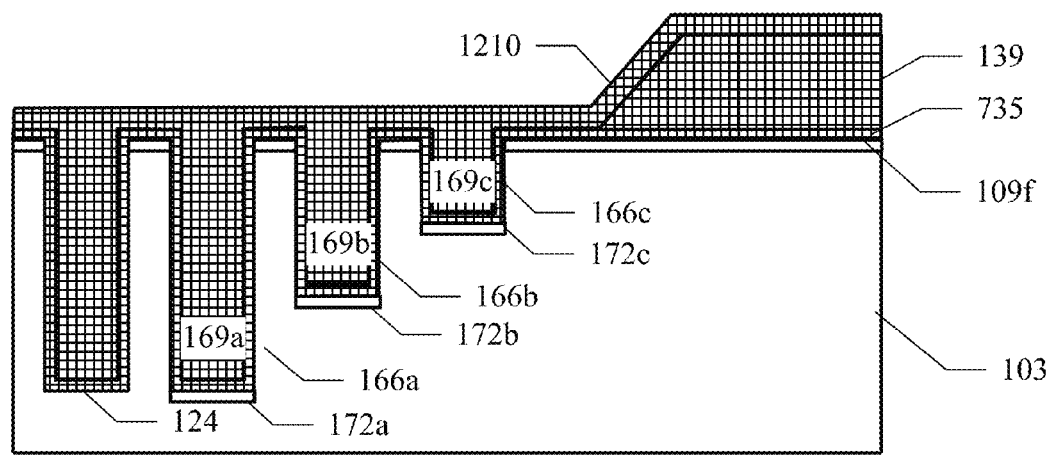

Turning to FIG. 12B, an oxide layer 1210 (for example, TEOS or BPSG) is deposited on the structure thus obtained, so as to fill the termination trenches 166a-166c (thereby defining the floating elements 169a-169c) and the gate trenches 124.

Figure 12C:
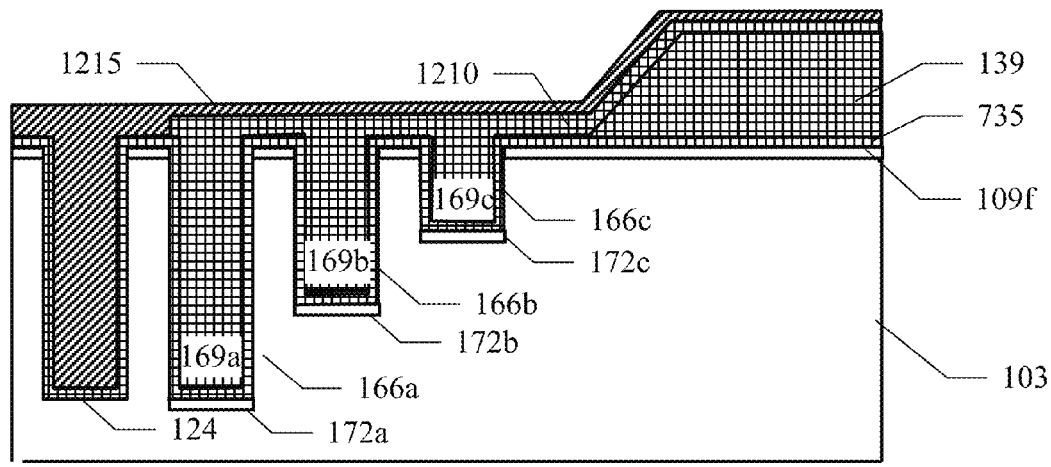

Turning to FIG. 12C, the oxide layer 1210 is selectively removed from the active area, thereby emptying the gate trenches 124. A polysilicon layer 1215 is deposited on the structure thus obtained (and doped), so as to fill the gate trenches 124.

Figure 12D:
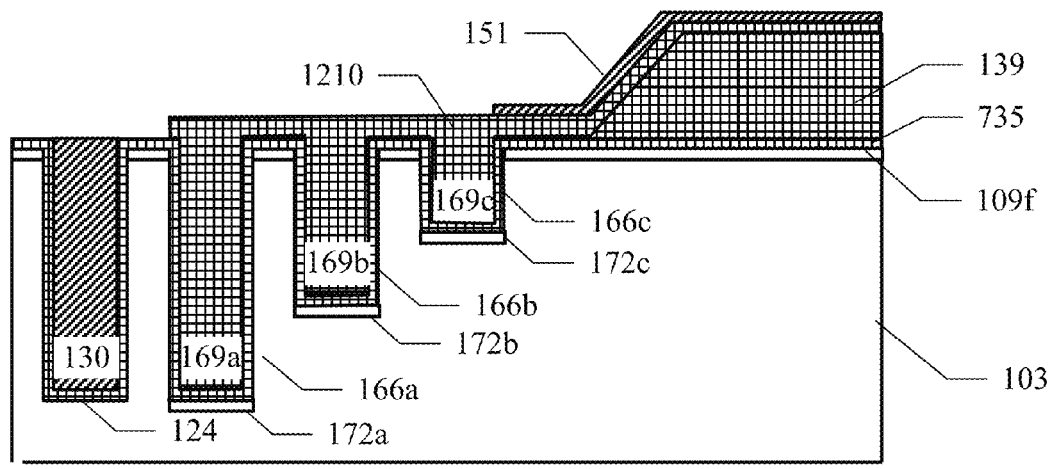

Turning to FIG. 12D, the polysilicon layer 1215 is selectively removed, so as to leave the gate regions 130 (in the gate trenches 124) and the polysilicon tracks 151 (visible in the figure over the field oxide layer 139).

Figure 12E:
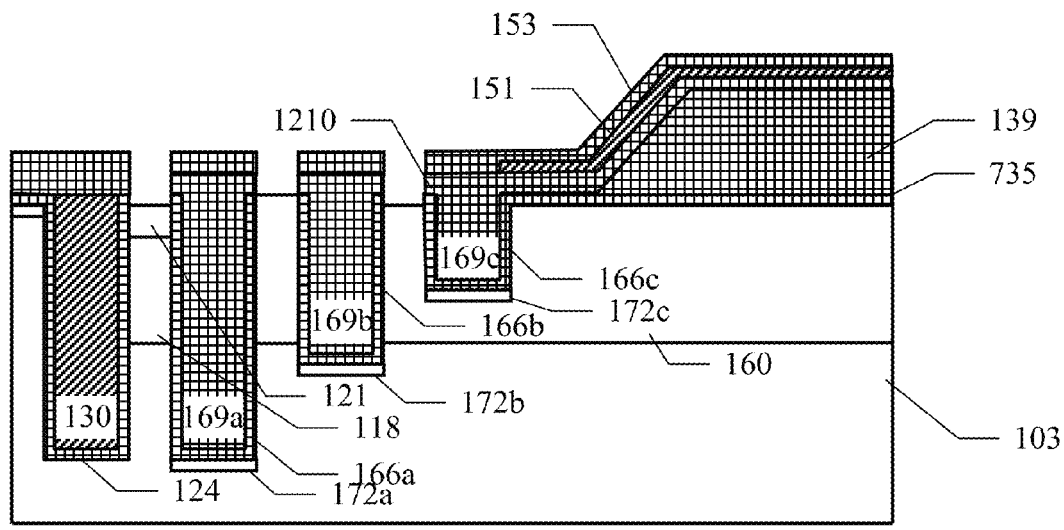

Turning to FIG. 12E, the intermediate layer 153 (of electrically insulating material) is deposited on the structure so obtained; the intermediate layer 153 and the oxide layer 1210 are selectively removed, so as to open the windows in correspondence to the source region and between the termination trenches. An implantation and diffusion operation is performed to complete the body regions 118 and the guard ring 160, and a further implantation and diffusion operation is performed to make the source regions 121.

Figure 12F:
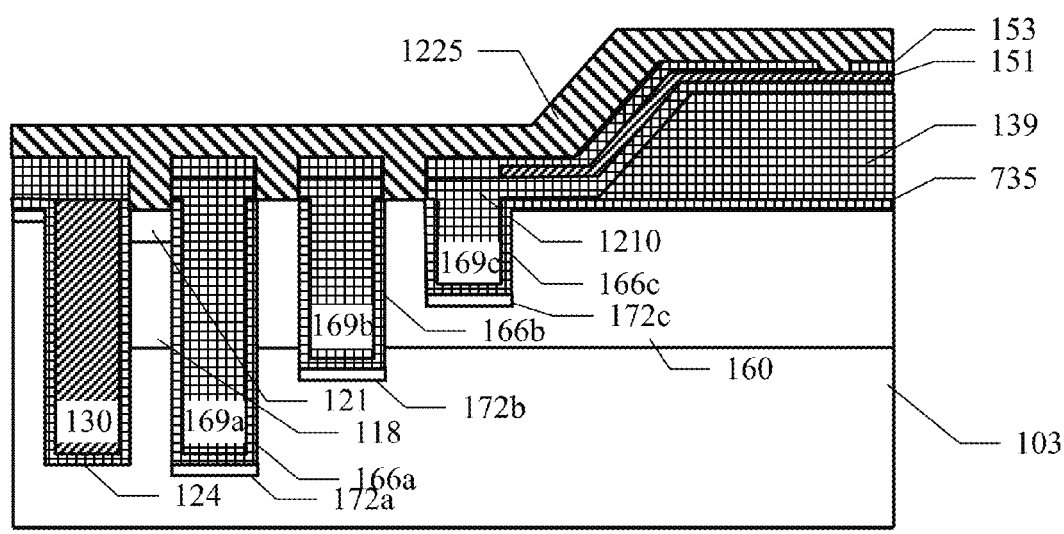

Turning to FIG. 12F, the intermediate layer 153 is selectively removed, so as to open the window in correspondence to the gate tap. A metal layer 1225 is deposited on the structure thus obtained. The metal layer 1225 is selectively removed, so as to obtain the source contact, the corresponding metal tracks and the gate contact (not shown in the figure).

With reference now to FIGS. 13A-13D, the main additional steps are shown of a manufacturing process of an electronic device according to a further embodiment of the present disclosure (always for completing the termination structure and with the edge ring, not shown in the figure, which may already have been done previously or it may be made subsequently).

Figure 13A:
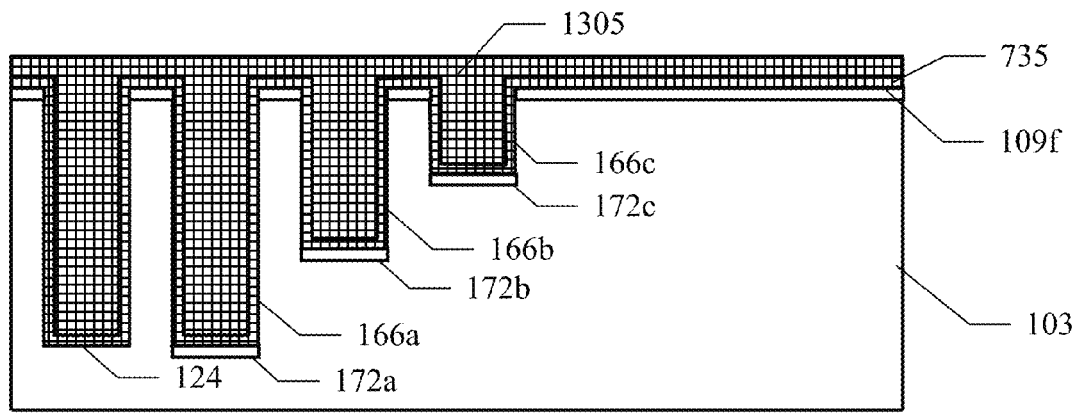
FIGS. 13A-13D show the main additional steps of a manufacturing process of an electronic device according to a further embodiment of the present disclosure.

Starting from FIG. 13A, a TEOS layer 1305 is deposited on the oxide layer 735 of the structure obtained in FIG. 10 (so as to fill the gate trenches 124 and the termination trenches 166a-166c).

Figure 13B:
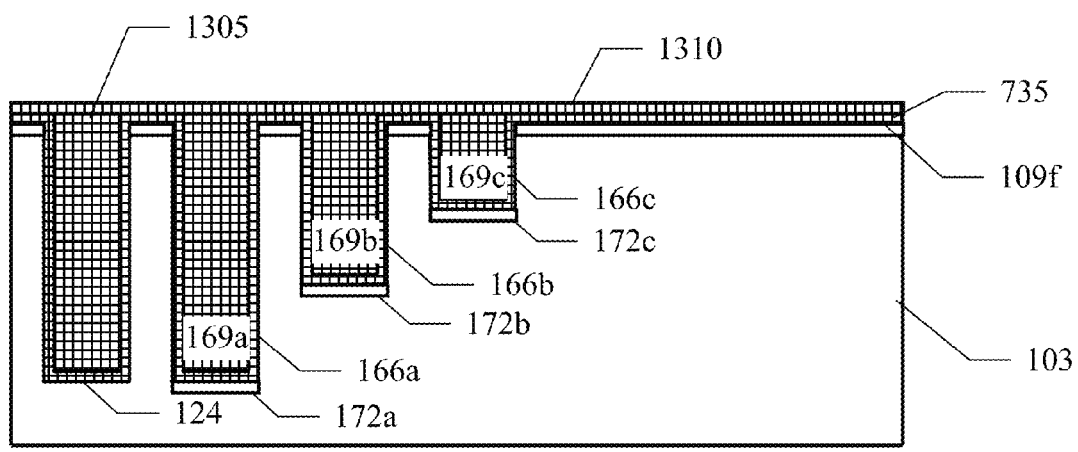

Turning to FIG. 13B, the TEOS layer 1305 is planarized (for example, by a CMP operation) down to reach an oxide layer 735 (so as to define the floating elements 169a-169c in the termination trenches 166a-166c). A Nitride layer 1310 is then deposited on the structure thus obtained.

Figure 13C:
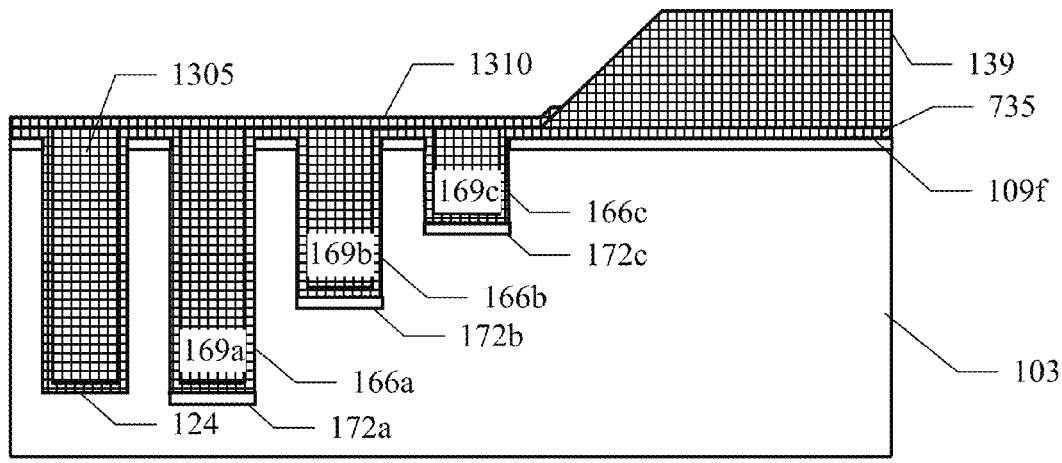
Figure 13D:
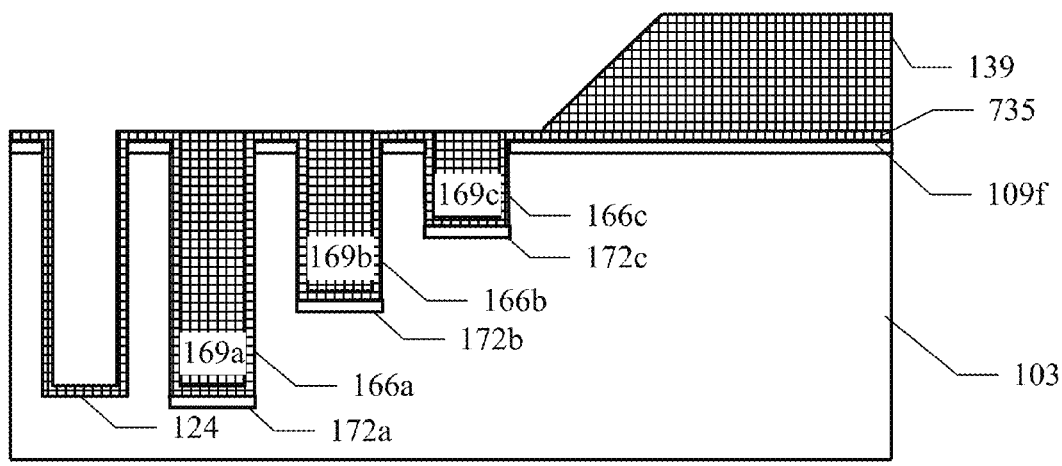

Turning to FIG. 13C, the Nitride layer 1310 is selectively removed in correspondence to the edge of the chip. The field oxide layer 139 is grown from the portion of the oxide layer 735 exposed by the Nitride layer 1310. The Nitride layer 1310 and the TEOS layer 1305 are selectively removed from the active area, thereby emptying the gate trenches 124; the emptying of the gate trenches 124 may be either total or partial, so as to leave a thicker oxide layer at the bottom thereof. At this point, the Nitride layer 1310 is removed completely, so as to obtain the structure shown in FIG. 13D (with the manufacturing process that then continues as above).

In general, the solution according to the different embodiments of the present disclosure use relatively simple production processes, even when the (gate and termination) trenches are deep (like in the power electronic devices wherein they may also reach depth of the order of 6-10 μm). Indeed, the bottom regions may be implanted through the termination trenches (at any depth) without any problem. Conversely, the reduced depth of the edge ring allows using standard machinery (and particularly, ion implanters at standard energy and ovens at standard temperature) and allows making it in a relatively short time (even with dopants with standard diffusion speed). Therefore, this solution is of general applicability, at relatively low costs (with a beneficial effect on the final cost of the electronic devices).

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), the term a/an should be intended as one or more items (unless expressly indicated otherwise), and the term means for (or any means-plus-function formulation) should be intended as any entity or structure suitable for carrying out the relevant function.

For example, an embodiment provides an electronic device integrated on a chip of semiconductor material; the chip has a main surface and a substrate region (of said semiconductor material with a first type of conductivity), which extends from the main surface. The electronic device comprises at least one vertical MOS transistor, which is formed in an active area of the chip. The MOS transistor comprises at least one body region (of said semiconductor material with a second conductivity type), which extends from the main surface in the substrate region. The MOS transistor comprises a set of one or more cells. Each cell comprises a source region (of said semiconductor material of the first conductivity type), which extends from the main surface in the body region. Each cell comprises a gate region (of electrically conductive material) in a gate trench, which extends from the main surface in the body region and in the substrate region; the gate region is electrically insulated from said semiconductor material by an insulating gate layer. The MOS transistor comprises a termination structure, which comprises a plurality of termination rings that surround at least part of the active area on the main surface. Each termination ring comprises at least one floating element (of electrically insulating material) in at least one termination trench, which extends from the main surface in the chip; each termination ring comprises at least one bottom region (of said semiconductor material of the second conductivity type), which extends from at least a deepest portion of a surface of the termination trench in the chip. The termination trenches have a depth from the main surface decreasing moving away from the active area.

However, the chip may have any shape, size and may be of any semiconductor material (for example, SiC, germanium, GaN); the regions of the chip may have any extent, and may be of any type (for example, inverting the regions of the N-type and of the P-type), with any concentration and type of dopants and/or with any electrically insulating/conductive materials. The electronic device may comprise any number of vertical MOS transistors of any type (for example, IGBT). The active area may have any shape and extent, and may comprise any number of body regions and of cells (down to only one), with any layout. The termination structure may comprise any number of termination rings (two or more). Each termination ring may surround either completely or only partially the active area (for example, with discontinuous or open termination rings). The bottom regions may extend from any portion (or more) of the termination trenches (for example, only at the bottom or a part thereof, and also at the lateral surfaces, in whole or in part). The termination trenches may have any depth (see below); in any case, the depth of the termination trenches may decrease in any way, either strictly or non-strictly (for example, with quadratic or logarithmic law).

In an embodiment, the termination structure comprises an edge ring (of said semiconductor material of the second conductivity type), which surrounds at least part of the active area on the main surface; the edge ring extends from the main surface in the substrate region to a depth lower than the depth of at least a deepest one of the termination trenches. The bottom region of said at least one deepest termination trench is separated from the edge ring.

However, the edge ring may surround either completely or only partially the active area (as above); the edge ring may have any depth, with any number of termination trenches being deeper than it (one or more). Furthermore, the bottom regions of the deepest termination trenches may be at any distance from the edge ring. The shallowest termination trenches or the trenches furthest from the active area are embedded in the edge ring (mesh).

In an embodiment, the bottom region of each deepest termination trench reaches the edge ring; moreover, the bottom region of the termination trench of a first one of the termination rings being proximal to the active area reaches the body region.

However, the bottom regions of the deepest termination rings may only reach the edge ring or may extend into it as well (similar considerations apply to the bottom region of the first termination trench with respect to the body region).

In any case, the bottom regions may have any other structure (in any combination); for example, the bottom regions may be omitted for the less deep trenches that are embedded in the edge ring, may be in part separated and in part connected to the edge ring, with the bottom region of the first termination trench that may be either separated or connected to the body region. In any case, the edge ring may also be omitted (with any extent of the bottom regions).

In an embodiment, the depth of the termination trench of a first one of the termination rings being proximal to the active area is substantially equal to a depth of the gate trenches.

However, the termination trenches of two or more innermost termination rings may have the same depth of the gate trenches, or the termination trenches of one or more innermost termination rings may also be deeper than the gate trenches; in any case, the possibility of having all the termination trenches shallower then the gate trenches is not excluded.

In an embodiment, the MOS transistor further comprises a source contact (of electrically conductive material), which contacts the source regions and said semiconductor material between the termination trenches of at least one first pair of the termination rings being proximal to the active area.

However, the source contact may contact the semiconductor material between the termination trenches of any number of pairs of termination rings (from one to all); this additional feature may be implemented with any depth of the termination trenches (even all less deep than the gate trenches), and vice-versa it may be omitted (even when the innermost termination trenches have the same depth of the gate trenches).

In an embodiment, the MOS transistor further comprises a field oxide layer on the main surface, which surrounds at least part of the active area; at least one least deep of the termination trenches is arranged in correspondence to the field oxide layer.

However, the field oxide may be of any type and with any thickness, and it may surround either completely or only partially the active area (as above).

Moreover, the least deep termination trenches under the field oxide may be in any number (from one to all, or even none when the termination trenches always reach the active area or the field oxide is absent).

In an embodiment, a width of the termination trenches along a moving-away direction from the active area decreases moving away from the active area. In addition or in alternative, a distance between each pair of adjacent termination structures increases moving away from the active area. In addition or in alternative, each termination structure comprises a plurality of termination trenches; a distance between each pair of termination trenches of the same termination structure increases moving away from the active area.

However, the width of the termination trenches and their distance (either in the same termination ring on among different termination rings) may vary in any way (for example, with a quadratic or logarithmic law); moreover, in case of discontinuous structure of the termination rings, the termination trenches may have any shape (for example, circular). The termination trenches may also vary in other ways (for example, with the lengths of the termination trenches in case of discontinuous structure of the termination rings that decrease moving away from the active area) and in any combination thereof. In any case, an implementation with the width and the distance of the termination trenches that are constant (for all or only part thereof) is not excluded.

In general, the above-described solution may be part of the design of an integrated circuit. The design may also be created in a hardware description language; moreover, if the designer does not manufacture chips or masks, the design may be transmitted by physical means to others. In any case, the resulting integrated circuit may be distributed by its supplier in raw wafer form, as a bare die, or in packages. Moreover, the above-described structure may be integrated with other circuits in the same chip; the chip may also be coupled with one or more other chips (such as a processor), or it may be mounted in intermediate products (such as mother boards). In any case, the integrated circuit is suitable to be used in complex systems (see below).

An embodiment provides a system comprising at least one of such electronic devices.

However, the system may be of any type (such as a motor controller, a voltage converter, a class-D amplifier) and it may comprise any number of electronic devices.

Generally, similar considerations apply if the electronic device and the system each has a different structure or comprises equivalent components (for example, of different materials), or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

An embodiment provides a method for manufacturing an electronic device integrated on a chip of semiconductor material; the chip has a main surface and a substrate region (of said semiconductor material with a first type of conductivity), which extends from the main surface. The method comprises forming at least one vertical MOS transistor in an active area of the chip by the following steps. At least one body region (of said semiconductor material with a second conductivity type) is formed so as to extend from the main surface in the substrate region. A set of one or more cells is formed each one by the following steps. A source region (of said semiconductor material of the first conductivity type) is formed so as to extend from the main surface in the body region. A gate trench is formed so as to extend from the main surface in the body region and in the substrate region. An insulating gate layer is formed in the gate trench. A gate region (of electrically conductive material) is formed in the gate trench, so as to be electrically insulated from said semiconductor material by the insulating gate layer. A termination structure is formed; the termination structure comprises a plurality of termination rings, which surround at least part of the active area on the main surface. Each termination ring is formed by the following steps. At least one termination trench is formed so as to extend from the main surface in the chip. At least one floating element (of electrically insulating material) is formed in the termination trench. At least one bottom region (of said semiconductor material of the second conductivity type) is formed so as to extend from at least one deepest portion of a surface of the termination trench in the chip. Said step of forming a termination structure comprises forming the termination trenches with a depth from the main surface decreasing moving away from the active area.

However, the electronic device may be made with different technologies, with different number and type of masks, or with other process parameters.

In an embodiment, the step of forming the termination trenches comprises the following steps. A stack of masking layers superimposed one to another is formed on the main surface; the masking layers are equal in number to the termination rings. An etching operation is performed for each termination ring by proceeding moving away from the active area; the etching operation selectively removes a portion of a free masking layer in correspondence to the termination trenches of the termination ring and of each previous termination ring. At least one further etching operation is performed for each termination ring by proceeding moving away from the active area; the further etching operation selectively removes a portion of the semiconductor material in correspondence to the termination trenches of the termination ring and of each previous termination ring, and it selectively removes a free portion of the masking layer in correspondence to the termination trench of each next termination ring.

In any case, the masking layers may be of any type and they may be etched in any way (see below).

In an embodiment, said step of forming a stack of masking layers comprises forming a masking sub-layer and a further masking sub-layer superimposed to each other for each masking layer. Said step of performing an etching operation for each termination ring comprises the following steps for each etching operation. A first etching sub-operation is performed; the first etching sub-operation is selective for the further masking sub-layer with respect to the masking sub-layer, and it has a length sufficient to remove each corresponding portion of the further masking sub-layer completely. A second etching sub-operation is performed; the second etching sub-operation is selective for the masking sub-layer with respect to the further masking sub-layer, and it has a length sufficient to remove each corresponding portion of the masking sub-layer completely. Said step of performing at least one further etching operation for each termination ring comprises the following steps for each one of said at least one further etching operation. A further first etching sub-operation is performed; the further first etching sub-operation is selective for the semiconductor material with respect to the further masking sub-layer, and it has a length corresponding to a depth of the termination trench of the corresponding termination ring for a last one of the termination rings and corresponding to a depth difference between the termination trench of the corresponding termination ring and the termination trench of a next one of the termination rings for each termination ring different from the last termination ring. A further second etching sub-operation is performed; the further second etching sub-operation is selective for the further masking sub-layer with respect to the semiconductor material and to the masking sub-layer, and it has a length sufficient to remove each corresponding portion of the further masking sub-layer completely. A further third etching sub-operation is performed; the further third etching sub-operation is selective for the masking sub-layer with respect to the semiconductor material and to the further masking sub-layer, and it has a length sufficient to remove each corresponding portion of the masking sub-layer completely.

However, the masking sub-layers may be of any type and etched with any selective gas mixture. Alternatively, each etching operation of the semiconductor material may be combined with the next etching operation of the further masking sub-layer, by using a gas mixture little selective between them (but always selective with respect to the masking layer) such as $SF_6+O_2$ for silicon and Nitride with respect to TEOS (for example, with a ratio between their etching rates less than 2-5). In any case, it is possible to use single masking layers (for example, of TEOS) and to remove them selectively with etching operations (of any type) with controlled length.

In an embodiment, said step of forming the termination trenches comprises performing an etching operation for each termination ring; the etching operation selectively removes said semiconductor material in correspondence to the termination trench of the termination ring, and it has a length corresponding to the depth of the termination trench of the termination ring.

However, the etching operation may be of any type (for example, wet, dry, plasma, sputter).

In an embodiment, a width of the termination trenches decreases moving away from the active area. Said step of forming the termination trenches comprises performing an etching operation; the etching operation selectively removes said semiconductor material in correspondence to the termination trenches of all the termination rings, and it has a length corresponding to the depth of the terminating trenches as a function of the width thereof.

However, the length of the etching may be calculated in another way (for example, graphically) as a function of the width and depth of the termination trenches.

In an embodiment, said step of forming a bottom region comprises implanting impurities of the second conductivity type into the chip along an implantation direction perpendicular to the main surface and/or along a plurality of implantation directions inclined with respect to the main surface.

However, the inclined implantation directions may be in any number and inclined at any angle (even different from each other in absolute value); in addition, the implantations along the inclined directions may also be combined with the implantation along the perpendicular direction. In any case, the bottom regions may also be made in another way (for example, by diffusion).

Generally, similar considerations apply if the same solution is implemented with an equivalent method (by using similar steps with the same functions of more steps or portions thereof, removing some steps being non-essential, or adding further optional steps); moreover, the steps may be performed in a different order, concurrently or in an interleaved way (at least in part).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
   a chip of semiconductor material having a main surface and a substrate region of said semiconductor material with a first type of conductivity extending from the main surface;
   at least one vertical MOS transistor, formed in an active area of the chip, the transistor including:
      at least one body region in the semiconductor material with a second conductivity type extending from the main surface in the substrate region;
      one or more cells, each cell having:
         a source region in the semiconductor material of the first conductivity type extending from the main surface in the body region;
         a gate trench;
         a gate region of electrically conductive material in the gate trench extending from the main surface in the body region and in the substrate region; and
         an insulating gate layer electrically insulating the gate region from said semiconductor material; and
   a termination structure including:
      a plurality of termination rings surrounding at least a part of the active area on the main surface, each termination ring including:
         at least one termination trench extending from the main surface in the chip;
         at least one floating element of electrically insulating material in the at least one termination trench; and
         at least one bottom region of said semiconductor material of the second conductivity type extending from at least a deepest portion of a surface of the termination trench in the chip, wherein the termination trenches each have a depth from the main surface decreasing moving away from the active area; and
      an edge ring in the substrate region, the edge ring having the second conductivity type, the termination rings extending into the edge ring, the edge ring extending from the main surface in the substrate region to a depth greater than a depth of at least one of the plurality of termination rings.

2. The electronic device according to claim 1 wherein the edge ring extends from the main surface in the substrate region to a depth smaller than a depth of at least a deepest one of the termination trenches, and wherein the bottom region of said at least one deepest termination trench is separated from the edge ring.

3. The electronic device according to claim 1 wherein the bottom region of a first one of the termination rings that is distal to the active area reaches the edge ring, and the bottom region of the termination trench of a second one of the termination rings that is proximal to the active area reaches the substrate region.

4. The electronic device according to claim 1 wherein the depth of the termination trench of a first one of the termination rings being proximal to the active area is substantially equal to a depth of the gate trenches.

5. The electronic device according to claim 4 wherein the MOS transistor further includes a source contact of electrically conductive material in contact with the source regions and said semiconductor material between the termination trenches of at least one first pair of the termination rings being proximal to the active area.

6. The electronic device according to claim 1 wherein the MOS transistor further includes a field oxide layer on the main surface surrounding at least part of the active area, at least one least deep of the termination trenches being arranged in correspondence to the field oxide layer.

7. The electronic device according to claim 1 wherein a width of the termination trenches along a first direction from the active area decreases moving away from the active area.

8. The electronic device of claim 1 wherein a distance between each pair of adjacent termination structures increases moving away from the active area.

9. The electronic device of claim 1 wherein each termination structure includes a plurality of termination trenches including the at least one termination trench, a distance between each pair of termination trenches increasing moving away from the active area.

10. A device, comprising:
a substrate having an outermost edge;
a transistor region in the substrate;
a termination structure formed in the substrate between the transistor region and the outermost edge, the termination structure including:
a plurality of insulating floating elements;
a plurality of termination trenches extending into the substrate, each trench including one of the plurality of insulating floating elements, each trench having a depth, the depth of each respective trench decreasing as the respective trench is further from the transistor region and closer to the outermost edge;
a protective layer on the substrate and on the plurality of termination trenches; and
a field oxide layer formed on the protective layer positioned between the termination structure and the outermost edge.

11. The device of claim 10 wherein each termination trench includes a doped bottom region.

12. The device of claim 11 wherein each termination trench includes doped side regions that are coupled to the bottom regions.

13. The device of claim 10 wherein the termination trenches are each part of a termination rings that surrounds the transistor region.

14. The device of claim 10 wherein the substrate has a first conductivity type and each termination trench includes a doped bottom region of a second conductivity type.

15. The device of claim 14 wherein the transistor region includes a vertical MOS transistor, the transistor including:
a body region of the second conductivity type in the substrate;
a source region of the first conductivity type between a top surface of the substrate and the body region;
a gate trench;
a gate region in the gate trench; and
an insulating gate layer electrically insulating the gate region from the substrate.

16. The device of claim 1 wherein the plurality of termination rings includes a first group of termination rings and a second group of termination rings, the first group being positioned between the at least one vertical MOS transistor and the second group of termination rings.

17. The device of claim 16, further comprising:
a protective layer on the main surface of the chip and on top surfaces of the first group of termination rings and the second group of termination rings;
a source metal layer on the protective layer, the source metal layer being in contact with the main surface between ones of the first group of termination rings.

18. The device of claim 17 wherein the source metal layer is configured to bias the substrate region of said semiconductor material that has the first type of conductivity.

19. The device of claim 18 wherein side and bottom surfaces of the second group of termination trenches are in the substrate region.

20. The device of claim 19 wherein bottom surfaces of the first group of termination trenches extend past the substrate region and portions of side surfaces of the first group of termination trenches are in the substrate region.

21. The device of claim 16, further comprising a protective layer on the main surface of the chip and on top surfaces of the first group of termination rings and the second group of termination rings and a source metal layer on the protective layer and isolated from the first group of termination rings and the second group of termination rings.

22. A device, comprising:
a semiconductor substrate having an active area and a termination structure area around the active area;
a transistor in the active area, the transistor including at least one cell having a source region;
a plurality of termination trenches in the termination structure area, each termination trench having a different depth, each termination trench including:
a floating element of electrically insulating material; and
a doped bottom region that is separated from a surface of the substrate by the floating element;
a protective layer on the substrate that covers the plurality of termination trenches, the protective layer including a plurality of openings that expose the surface of the substrate, at least one of the plurality of openings is between two of the plurality of termination trenches; and
a conductive layer coupled to the source region, the conductive layer formed on the protective layer and in the plurality of openings.

23. The device of claim 22 wherein the depth of each termination trench decreases as the termination trenches are further from the active area.

24. The device of claim 22 wherein the substrate has a first conductivity type and each doped bottom region of a second conductivity type.

25. The device of claim 22 wherein the doped bottom region is u-shaped.

26. The device of claim 25 wherein each trench includes sidewalls and portions of the u-shaped bottom region extend along the sidewalls.

27. The device of claim 22 wherein the transistor is a vertical MOS transistor that includes a body region in the substrate, the source region is in the body region, and the at least one cell includes:
a gate region in the body region and in the substrate; and
an insulating gate layer between the gate region and the substrate.

28. The device of claim 27 wherein each termination trench extends at least partially into the body region.

* * * * *